United States Patent
Saeki

(10) Patent No.: US 6,564,359 B2
(45) Date of Patent: May 13, 2003

(54) CLOCK CONTROL CIRCUIT AND METHOD

(75) Inventor: Takanori Saeki, Tokyo (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 09/995,517

(22) Filed: Nov. 28, 2001

(65) Prior Publication Data

US 2002/0070783 A1 Jun. 13, 2002

(30) Foreign Application Priority Data

Nov. 29, 2000 (JP) ........................................ 2000-363728

(51) Int. Cl.[7] .............................................. G06F 17/50

(52) U.S. Cl. .......................................................... 716/5

(58) Field of Search ..................................... 716/1, 2, 6

(56) References Cited

U.S. PATENT DOCUMENTS 5,210,700 A * 5/1993 Tom ............................... 716/6
6,173,432 B1 * 1/2001 Harrison ......................... 716/1

FOREIGN PATENT DOCUMENTS

TW 271023 2/1996 ............. H03L/7/07

OTHER PUBLICATIONS

Horowitz, M. et al, "PLL Design for a 500 MB/s Interface", IEEE, ISSCC 93, Session 10, pps 160–161.

Sidiropoulos, S. et al, "A Semi–Digital DLL wit h Unlimited Phaes Shift Capability and 0.08–400MHz Operating Range", 1997 IEEE, ISSCC 97, Session 20, pps 332–333.

* cited by examiner

Primary Examiner—Matthew Smith
Assistant Examiner—Thuan Do
(74) Attorney, Agent, or Firm—Hayes Soloway, P.C.

(57) ABSTRACT

A clock control circuit includes a multiphase clock generating circuit receiving an output signal of a input buffer for generating multiphase clocks; a selector circuit receiving multiphase clocks output from the multiphase clock generating circuit for selecting one of the multiphase clocks; a first variable delay circuit for delaying the output of the selector circuit; a clock buffer dummy receiving the output signal of the variable delay circuit; a phase comparator circuit for detecting a phase difference between an output from the multiphase clock generating circuit and an output of the clock buffer dummy; and a filter for smoothing the output of the phase comparator circuit. The first variable delay circuit has its delay time varied by the output of the filter. The clock control circuit further includes a second variable delay circuit, receiving the output signal of the input buffer, having its delay time varied by the output of the filter; an adder circuit for adding the filter output and an input set value; a third variable delay circuit, receiving the output signal of the input buffer, having its delay time varied by the output of the adder circuit; and clock buffers receiving output signals of respective ones of the second and third variable delay circuits.

19 Claims, 19 Drawing Sheets

PULSE-WIDTH CORRECTION CIRCUIT

MULTIPLEXER CIRCUIT

T          (1/2)T

CLOCK CONTROL CIRCUIT AND METHOD

FIELD OF THE INVENTION

This invention relates to a clock control circuit and to a clock control method.

BACKGROUND OF THE INVENTION

An arrangement using a DLL (Delayed-Locked Loop) of the kind shown in FIG. 18 is known as a circuit that generates a signal having a prescribed phase with respect to an input signal. With regard to the arrangement shown in FIG. 18, see Reference 1 (ISSCC 1997 pp. 332–333, S. Sidiropoulos and Mark Horowitz et al., "A Semi-Digital DLL with Unlimited Phase Shift Capability and 0.08–400 MHz Operating Range").

As shown in FIG. 18, the DLL has an input buffer 11, a voltage-controlled delay line 14, a phase comparator 12 for detecting a phase difference between an output signal of the voltage-controlled delay line 14 and an output signal of the input buffer 11, and a filter 13 for smoothing a phase-difference detection signal output from the phase comparator 12. The voltage-controlled delay line 14 comprises a plurality of cascade-connected buffers. The phase comparator 12 is constituted by, e.g., a D-type flip-flop. The voltage-controlled delay line 14 is supplied with a voltage obtained by integrating the output signal of the phase comparator 12 by the filter 13, which includes a charge pump and an RC filter for converting the output signal of the phase comparator 12 to a voltage signal. The delay time in the voltage-controlled delay line 14 is variably set and feedback control is performed in such a manner that the phase of the output of input buffer 11 and the phase of the output of voltage-controlled delay line 14 will coincide (i.e., so that the phase difference between them will become zero). The multiple buffers of the voltage-controlled delay line 14 produce output clocks of equally spaced phase differences.

FIG. 19 illustrates a clock control circuit that produces a multiphase clock by replacing the voltage-controlled delay line 14 of FIG. 18 with a variable oscillator circuit 15 such as a VCO (Voltage-Controlled Oscillator). With regard to the arrangement shown in FIG. 19, see Reference 2 (ISSC 1993 pp. 160–161, Mark Horowitz et al., "PLL Design for a 500 MB/s Interface"). FIG. 19 schematically illustrates one part of the main loop of a PLL circuit described in Reference 2. The variable oscillator circuit 15 such as a VCO produces a plurality of clock outputs (e.g., a plurality of clock outputs of equally spaced phase differences) and supplies these to transmit and receive fine loops (not shown) so that the phase of the internal clocks undergoes fine adjustment.

The arrangements shown in FIGS. 18 and 19 have a feedback loop constituted by a DLL or PLL and exhibit phase jitter ascribable to the feedback loop. This makes it difficult to generate correctly a signal of a desired phase. The present invention has been devised in view this problem.

SUMMARY OF THE DISCLOSURE

Accordingly, it is an object of the present invention to provide a clock control circuit and method for precisely generating output clocks of a desired phase difference with respect to an input clock.

In accordance with one aspect of the present invention, the foregoing object is attained by providing a clock control circuit comprising: a multiphase clock generating circuit for generating and outputting a plurality of clocks, phases of which differ from one another (termed "multiphase clocks"), a selector circuit, receiving a plurality of clocks output from said multiphase clock generating circuit, for selecting as an output signal one of the clocks received; a phase comparator circuit for detecting and outputting a phase difference between an output signal obtained by delaying the output signal of said selector circuit through a first variable delay circuit and one of the clocks output from said multiphase clock generating circuit; a filter for smoothing a phase difference detection signal output from said phase comparator circuit, an output signal of said filter being used for varying a delay time of said first variable delay circuit; and a second variable delay circuit, a delay time thereof varied by the output signal of said filter, wherein a signal obtained by delaying the input clock signal through said second variable delay circuit is delivered as an output clock.

A clock control circuit in accordance with another aspect of the present invention, comprises: a phase-difference generating circuit for outputting a signal obtained by delaying an input clock by a predetermined phase difference on the basis of phase decision information applied thereto; a first variable delay circuit for delaying an output of the phase-difference generating circuit; a phase comparator circuit for detecting a phase difference between the output of the phase-difference generating circuit and an output signal from the first variable delay circuit; and a filter for smoothing the phase-difference detection signal output from the phase comparator circuit; the first variable delay circuit having its delay time varied by the output of the filter, and the clock control circuit further comprising a second variable delay circuit having its delay time varied by the output of the filter; wherein a signal obtained by delaying the input clock by the second variable delay circuit is delivered as an output clock.

A clock control circuit in accordance with another aspect of the present invention, comprises: a phase-difference generating circuit, to which an input clock and an output clock are input, for producing first and second output signals, which have a phase difference between them decided by entered phase decision information, based upon the input clock and the output clock; a first variable delay circuit for delaying the second output signal of the phase-difference generating circuit; a phase comparator circuit for detecting and outputting the phase difference between the first and second output signals output from the phase-difference generating circuit; and a filter for smoothing the phase-difference detection signal output from the phase comparator circuit; the first variable delay circuit having its delay time varied by the output of the filter, and the clock control circuit further comprising a second variable delay circuit having its delay time varied by the output of the filter; wherein signals obtained by delaying the input clock by each of the first and second variable delay circuits are delivered as first and second output clocks, and the first output clock enters the phase-difference generating circuit as the output clock.

A clock control method in accordance with further aspect of the present invention comprises the following steps:
  step 1: generating, by a multiphase clock generating circuit that has received an input clock signal from an input buffer, a plurality of clocks, the phases of which differ from one another, from the input clock signal;
  step 2: selecting one of the clocks from said multiphase clock generating circuit by a selector circuit;
  step 3: delaying the selected clock by a first variable delay circuit;
  step 4: detecting, by a phase comparator circuit, a phase difference between an output signal of a clock buffer receiving an output signal from said first variable delay circuit and one of the clocks output from said multiphase clock generating circuit, and variably adjusting a delay time of said first variable delay circuit on the basis of a signal obtained by smoothing the result of the phase comparison by a filter; and step 5: producing an output clock signal, having a desired phase relationship with respect to the input clock signal, from a clock buffer that receives an output signal from a second variable delay circuit, to which an output signal of said input buffer is fed and which has a delay time varied by the output signal of said filter.

A clock control method in accordance with further aspect of the present invention comprises the following steps:

step 1: supplying an output signal of an input buffer, which receives an entered clock, to a phase-difference generating circuit;

step 2: generating, by said phase-difference generating circuit, a signal obtained by delaying an output signal of said input buffer by a predetermined phase difference on the basis of phase decision information applied thereto;

step 3: detecting, by a phase comparator circuit, a phase difference between an output of a clock buffer dummy, which receives as an input an output signal from a first variable delay circuit that delays an output signal of said phase-difference generating circuit, and the output signal of said phase-difference generating circuit;

step 4: smoothing a result of the phase comparison by a filter and varying delay time of said first variable delay circuit by an output signal from said filter; and step 5: producing an output clock signal from a clock buffer which receives as an input an output signal from a second variable delay circuit which receives an output signal of said input buffer and which has its delay time varied by the output of said input buffer.

Still other objects and advantages of the present invention will become readily apparent to those skilled in this art from the following detailed description in conjunction with the accompanying drawings, in which like reference characters designate the same or similar parts throughout the figures thereof, wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
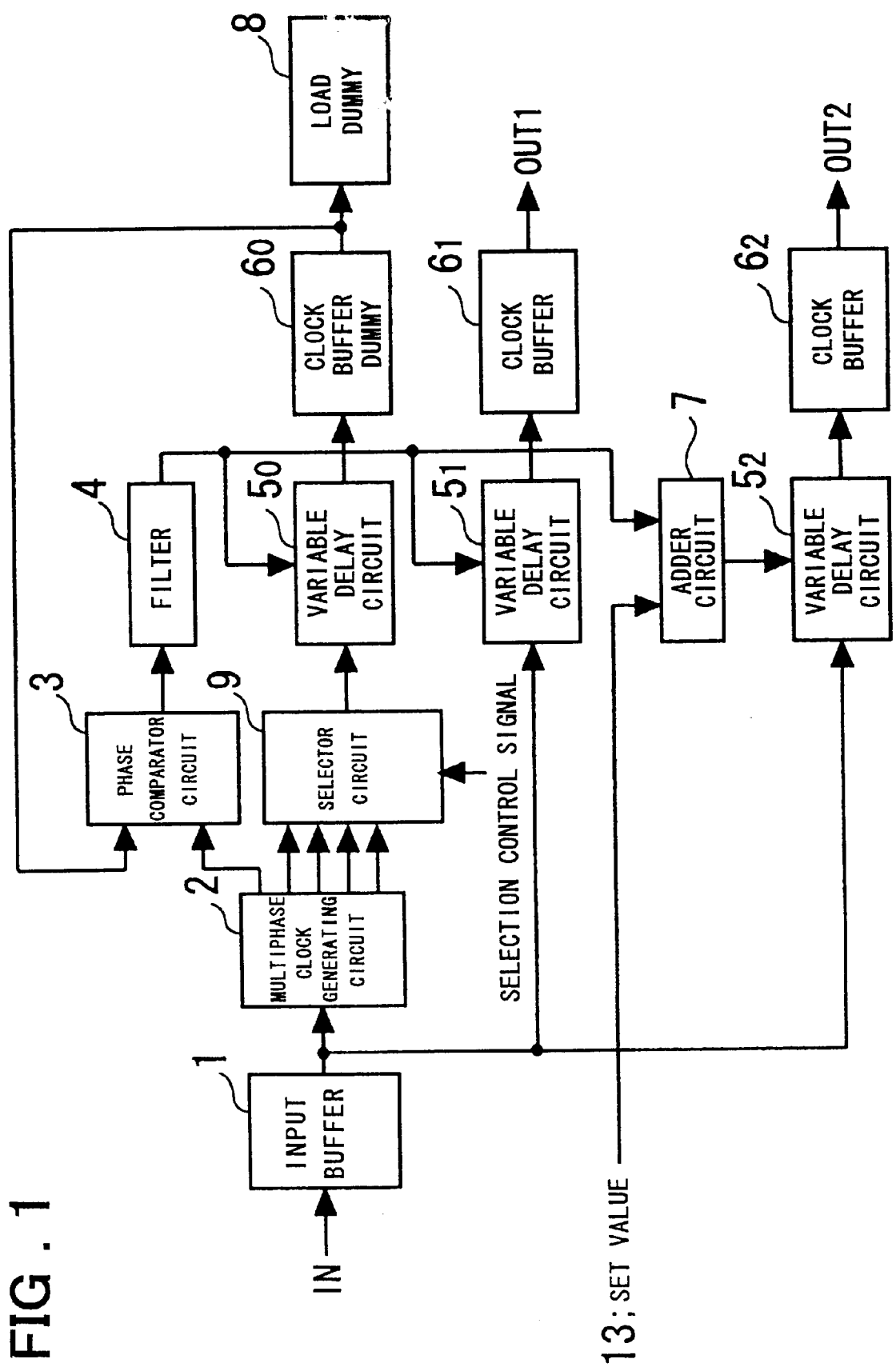
FIG. 1 is a block diagram illustrating the structure of a first embodiment of the present invention.

Preferred embodiments for practicing the present invention will be described below. A clock control circuit in accordance with a preferred embodiment of the present invention, as shown in FIG. 1, comprises: a multiphase clock generating circuit (2) for generating and outputting a plurality of clocks, the phases of which differ from one another (referred to as "multiphase clocks"), from a clock that enters from an input buffer (1); a selector circuit (9), to which the multiphase clocks output from the multiphase clock generating circuit are input, for selecting one of the multiphase clocks that corresponds to a desired phase difference; a variable delay circuit ($5_0$) for delaying the output of the selector circuit; a clock buffer dummy ($6_0$), to which the output of the variable delay circuit ($5_0$) is input, for driving a load (8) of a dummy; a phase comparator circuit (3) for detecting a phase difference between an output from the multiphase clock generating circuit (2) and an output of the clock buffer dummy ($6_0$); and a filter (4) for smoothing the phase-difference detection signal output from the phase comparator circuit (3). The variable delay circuit ($5_0$) has its delay time varied by the output of the filter (4). The clock control circuit further comprises a variable delay circuit ($5_1$), to which the output of the input buffer (1) is input, having its delay time varied by the output of the filter (4), and a clock buffer ($6_1$) to which the output of the variable delay circuit ($5_1$) is input.

The clock control circuit further comprises: an adder circuit (7) for adding the output of the filter (4) and a set value (13) input thereto; a variable delay circuit ($5_2$), to which the output of the input buffer (1) is input, having its delay time varied by the output of the adder circuit (7); and a clock buffer ($6_2$) to which the output of the variable delay circuit ($5_2$) is input.

One clock signal of the multiphase clock signals is fed to the phase comparator circuit (3), a clock signal having a desired phase difference with respect to this one clock signal fed to the phase comparator circuit (3) is selected from among the multiphase clock signals by the selector circuit (9) and is supplied to the variable delay circuit ($5_0$). The delay time of the variable delay circuit ($5_0$) is variably controlled in such a manner that the delay time of the variable delay circuit ($5_0$) and clock buffer dummy ($6_0$) will become equal to the phase difference.

An output OUT1 of the clock buffer ($6_1$) is a signal having a phase identical with that of the output of the clock buffer dummy ($6_0$), and an output OUT2 of the clock buffer ($6_2$) is a signal having a phase difference, with respect to the output of the clock buffer dummy ($6_0$), that corresponds to a value obtained by adding or subtracting the set value (13) by the adder circuit (7).

Figure 3:
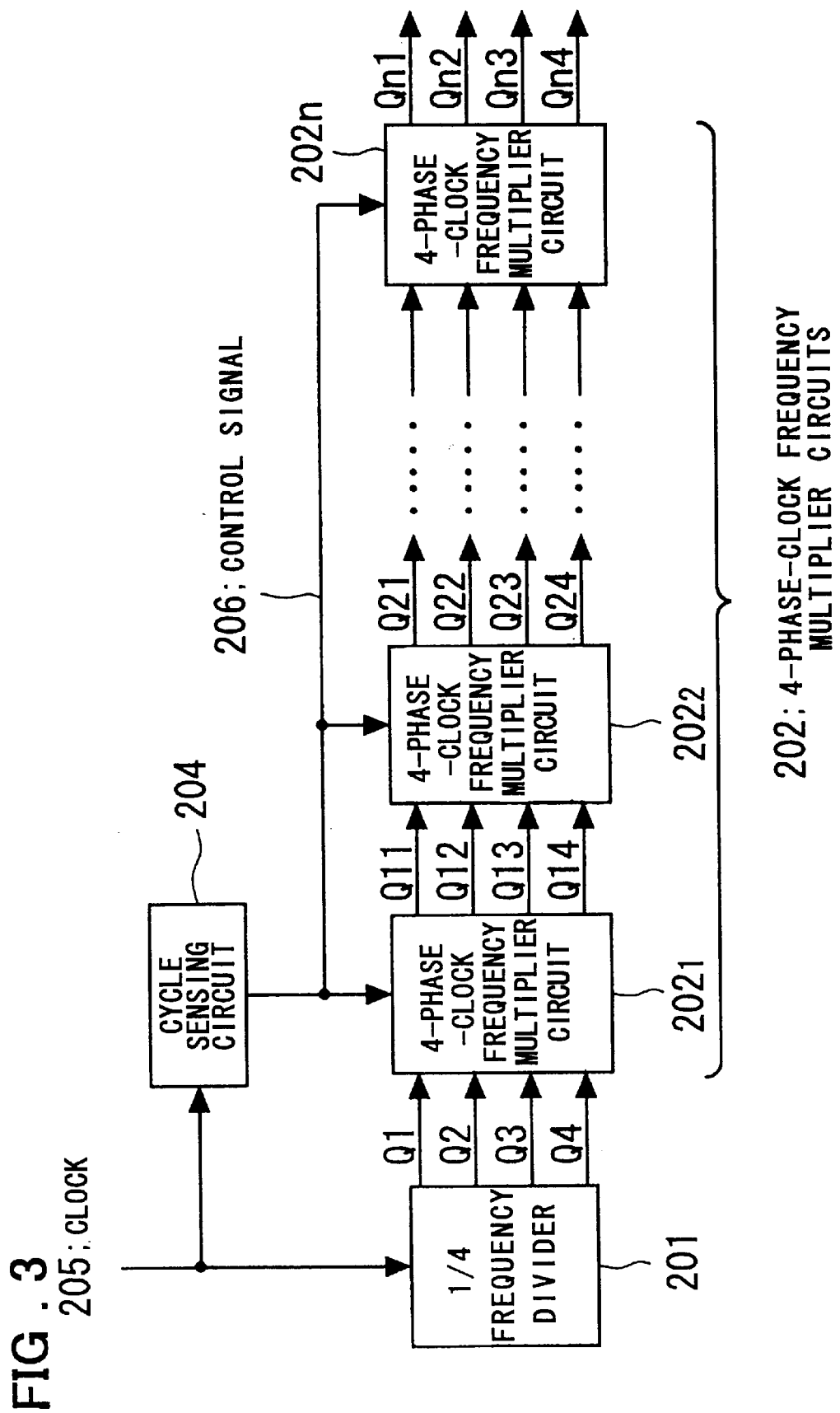
FIG. 3 is a block diagram illustrating the structure of a multiphase clock generating circuit according to the first embodiment of the present invention.

In this embodiment of the present invention, as shown in FIG. 3, the multiphase clock generating circuit (2) includes a frequency divider circuit (201) for frequency dividing an input clock and generating multiphase clocks, and a multiphase-clock frequency multiplier circuit (202), to which the multiphase clocks output from the frequency divider circuit are input, for generating multiphase clocks obtained by frequency multiplying the clocks.

As shown in FIG. 4, the multiphase-clock frequency multiplier circuit (202) has 2n-number of timing-difference dividing circuits (208 to 215), to which n-phase clocks (first to nth clocks) are input, for outputting signals obtained by dividing the timing difference between two inputs thereto, wherein timing-difference dividing circuits of odd numbers [(2I−1)th, where $1 \leq I \leq n$] have Ith identical clocks input thereto from among the n-phase clocks, and timing-difference dividing circuits of even numbers [(2I)th, where $1 \leq I \leq n$ n] have an Ith clock and an (I+1)th clock [where the (n+1)th is the first) input thereto from among the n-phase clocks.

A Jth (where $1 \leq J \leq 2n$) pulse-width correction circuit (216 to 223) has as its inputs the output of a Jth (where $1 \leq J \leq 2n$) timing-difference dividing circuit and the output of a (J+2 mod n)th (where J+2 mod n is the remainder obtained by dividing J+2 by n) timing-difference dividing circuit. For example, the inputs to the pulse-width correction circuit (216) are outputs T21, T23 of the timing-difference dividing circuits (208, 210), and the inputs to the pulse-width correction circuit (217) are outputs T22, T24 of the timing-difference dividing circuits (209, 211).

A Kth (where $1 \leq K \leq n$) multiplexing circuit (224 to 227) has as its inputs the output of a Kth pulse-width correction circuit and the output of a (K+n)th pulse-width correction circuit, multiplexes these signals and outputs the result.

Figure 9:
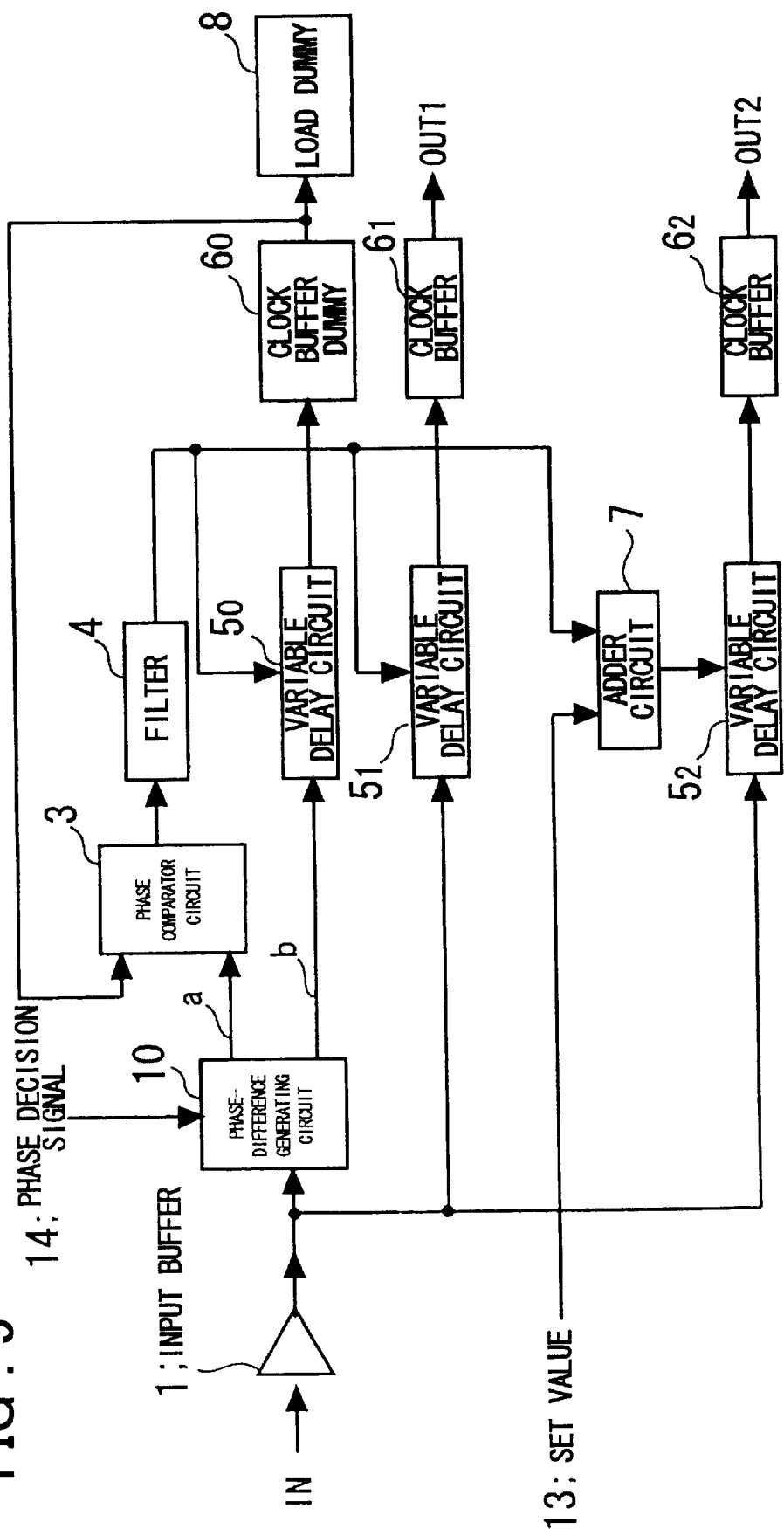
FIG. 9 is a diagram illustrating the structure of a modification of the second embodiment of the present invention.

In another embodiment for carrying out the present invention, as shown in FIG. 9, a clock control circuit comprises: a phase-difference generating circuit (10), to which an output of an input buffer (1) is input, for outputting a signal obtained by delaying the output of the input buffer with a predetermined phase difference on the basis of phase decision information (14); a variable delay circuit ($5_0$) for delaying an output of the phase-difference generating circuit (10); a clock buffer dummy for driving an output of the variable delay circuit ($5_0$); a phase comparator circuit (3) for detecting a phase difference between an output from the phase-difference generating circuit (10) and an output of the clock buffer dummy ($6_0$); and a filter (4) for smoothing the output from of phase comparator circuit (3). The variable delay circuit ($5_0$) has its delay time varied by the output of the filter (4). The clock control circuit further comprises: a variable delay circuit ($5_1$), to which the output of the input buffer (1) is input, having its delay time varied by the output of the filter (4); an adder circuit (7) for adding the output of the filter (4) and an entered set value (13); a variable delay circuit ($5_2$), to which the output of the input buffer (1) is input, having its delay time varied by the output of the adder circuit (7); and clock buffers ($6_1$, $6_2$) to respective ones of which the outputs of the variable delay circuits ($5_1$, $5_2$) are input.

Figure 10:
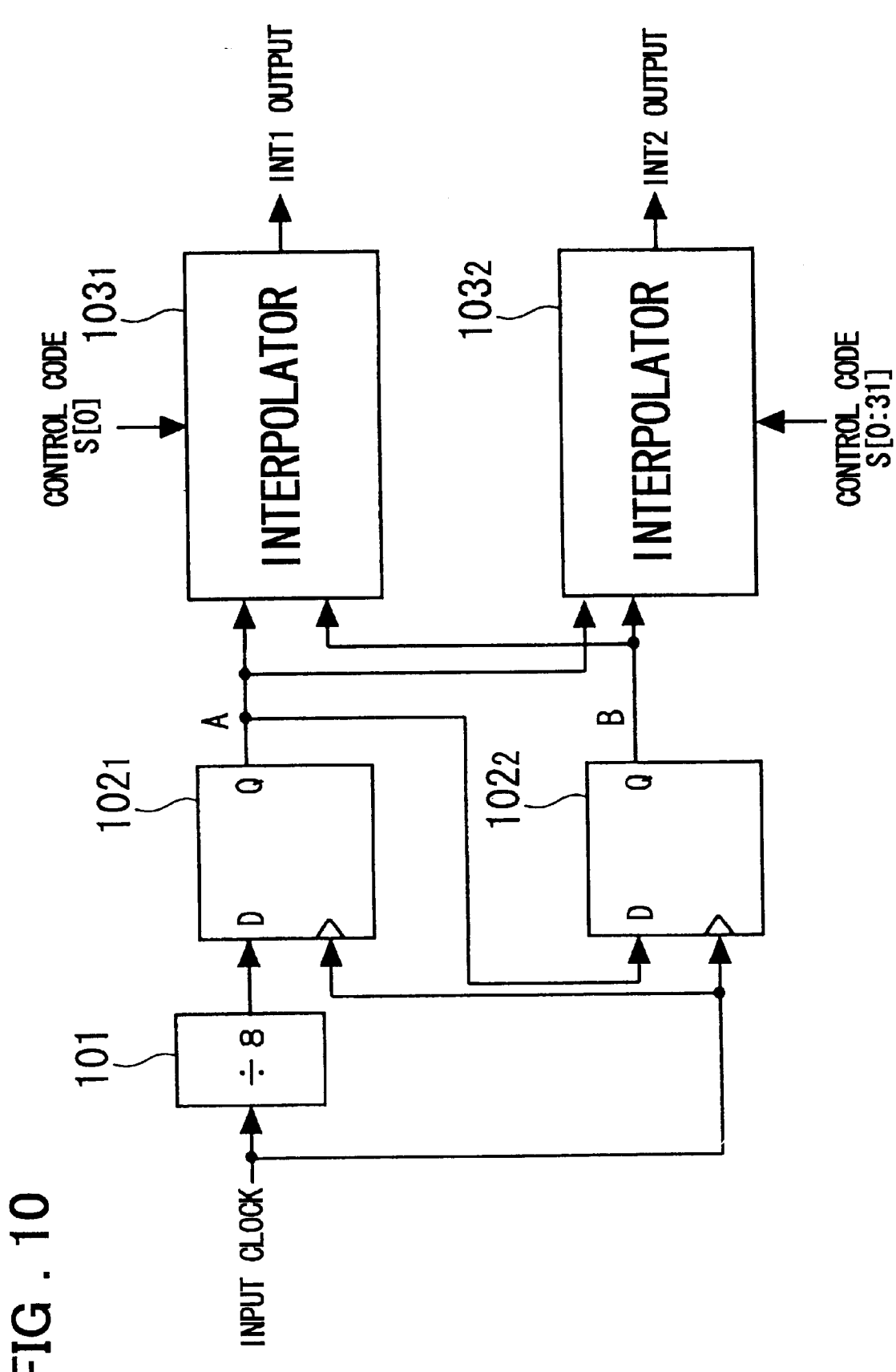
FIG. 10 is a block diagram illustrating the structure of a phase-difference generating circuit according to the second embodiment of the present invention.

As shown in FIG. 10, the phase-difference generating circuit (10) has: a frequency divider circuit (101) for frequency dividing an input clock; a first flip-flop ($102_1$) for sampling the output of the frequency divider circuit (101) at a rising or falling edge of the input clock; a second flip-flop ($102_2$) for sampling the output of the first flip-flop at a rising or falling edge of the input clock; a first interpolator ($103_1$), to which outputs of the first and second flip-flops are input, for producing an output signal (INT1) having a delay time decided by a time obtained by dividing the timing difference between the two outputs by a first interior-division ratio; and a second interpolator ($103_2$), to which outputs of the first and second flip-flops are input, for producing an output signal (INT2) having a delay time decided by a time obtained by dividing the timing difference between the two outputs by a second interior-division ratio.

The first and second interpolators ($103_1$, $103_2$) output signals obtained by internally dividing, by different interior-division ratios, input-signal phase differences (time differences) on the basis of the phase decision information (14 in FIG. 9) applied thereto, and the signal (INT1) supplied to the phase comparator circuit (3) is set to have a desired phase difference (e.g., 90°) with respect to the output signal (INT2) supplied to the first variable delay circuit ($5_0$).

Figure 13:
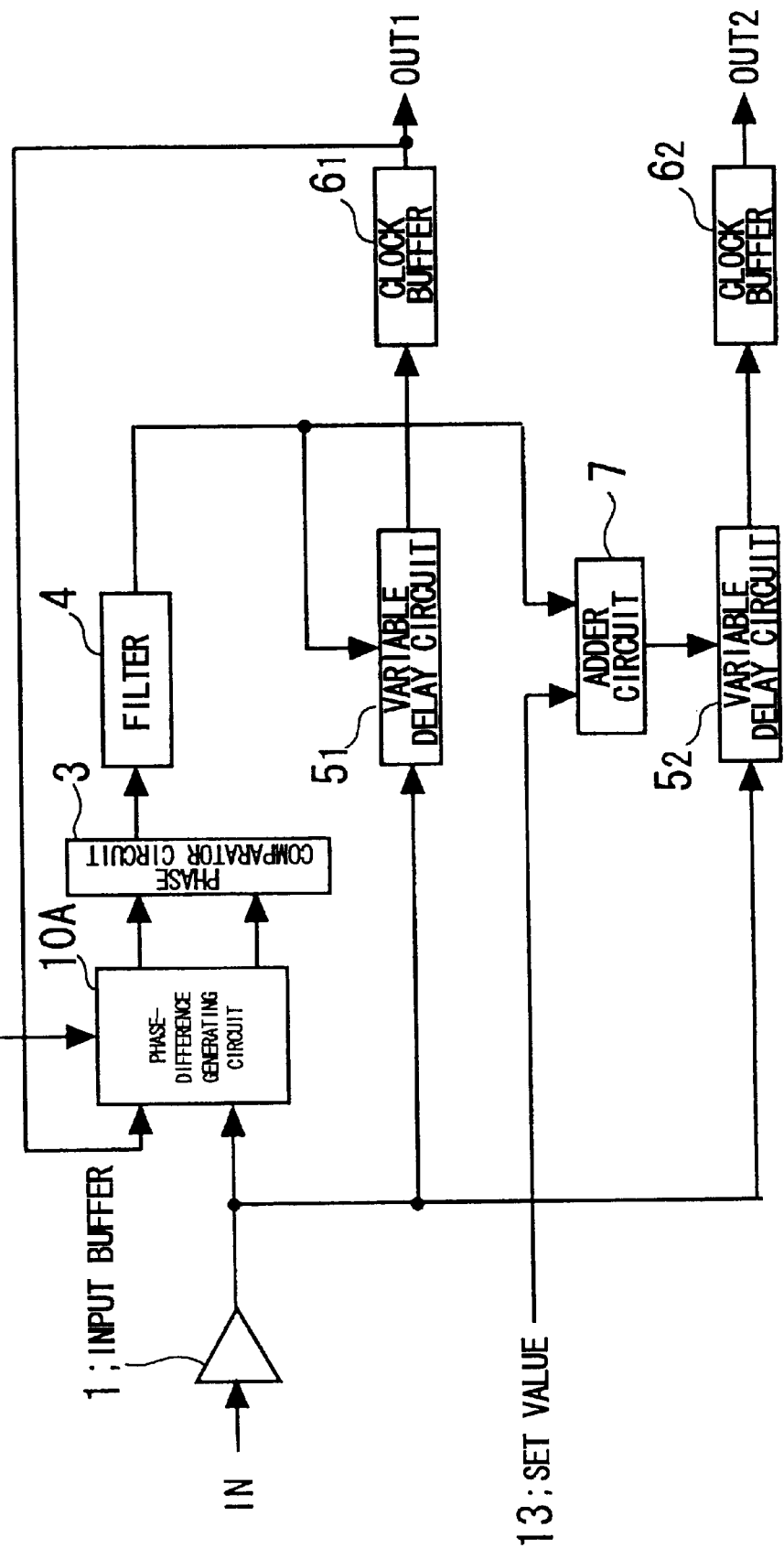
FIG. 13 is a diagram illustrating the structure of a modification of the third embodiment of the present invention.

In another embodiment of the present invention, as shown in FIG. 13, a clock control circuit comprises: an input buffer (1) which receives a clock; a phase-difference generating circuit (10A), to which an input clock from the input buffer (1) is input from one input terminal and to which an output clock is input from another input terminal, for producing two output signals, which have a phase difference decided by phase decision information (14), from an input clock and an output clock on the basis of the phase decision information (14) input thereto; a phase comparator circuit (3) for detecting a phase difference between the two outputs of the phase-difference generating circuit; a filter (4) for smoothing an output of the phase comparator circuit; a variable delay circuit ($5_1$) for delaying the output of the input buffer by a delay time varied by the output of the filter (4); a first clock buffer ($6_1$), to which the output of the first variable delay circuit is input, for producing a first output clock; an adder circuit (7) for adding the output of the filter (4) and an input set value (13); a variable delay circuit ($5_2$) to which the output of the input buffer (1) is input, having its delay time varied by the output of the adder circuit (7); and a clock buffer ($6_2$), to which the output of the second variable delay circuit ($5_2$) is input, for producing a second output clock; wherein the first output clock produced by the first clock buffer ($6_1$) enters the phase-difference generating circuit (10A).

Figure 14:
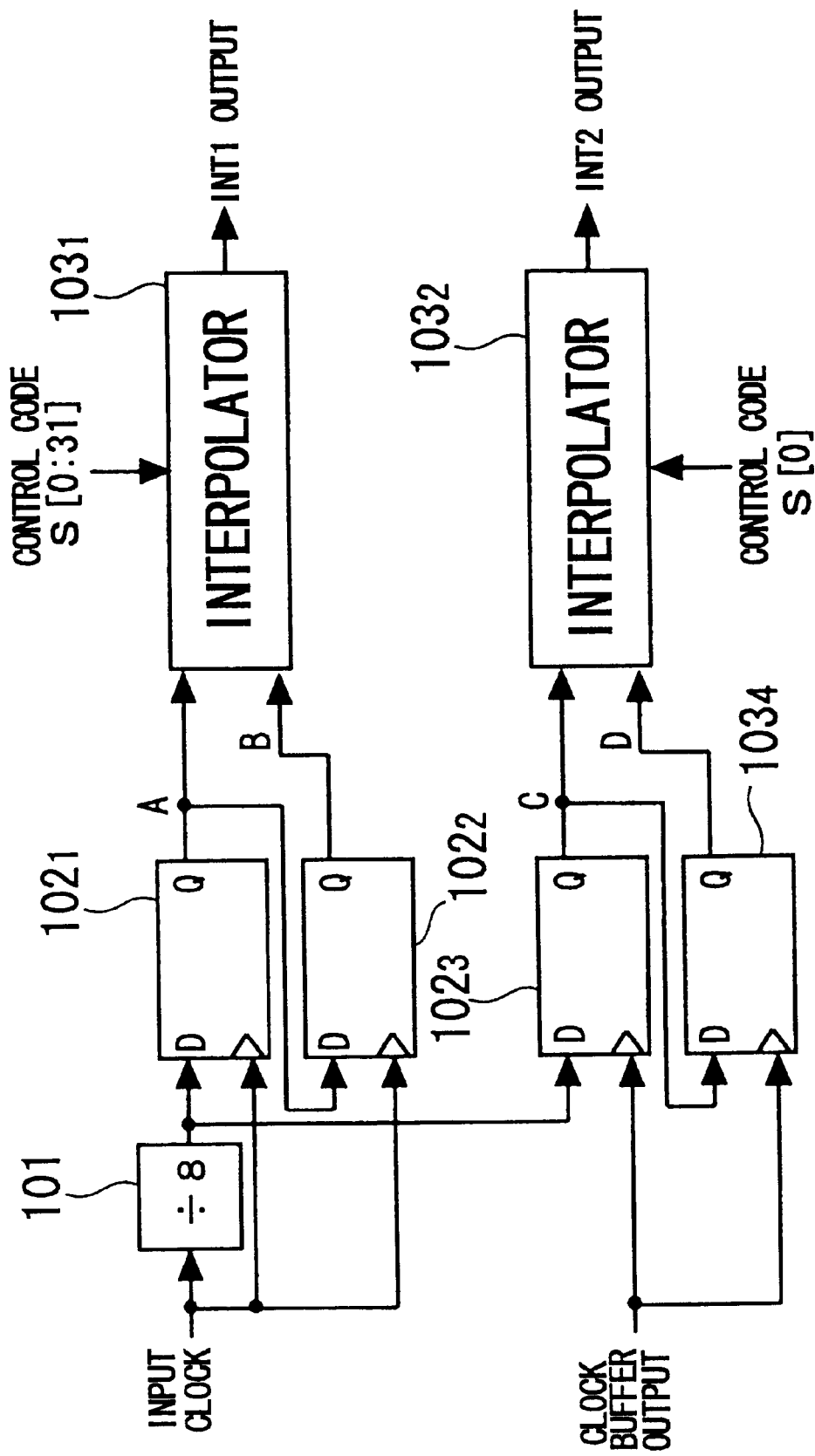
FIG. 14 is a block diagram illustrating the structure of a phase-difference generating circuit according to the third embodiment of the present invention.

As shown in FIG. 14, the phase-difference generating circuit (10A) has: a frequency divider circuit (101) for frequency dividing an input clock; a first flip-flop ($102_1$) for sampling the clock, which has been frequency-divided by the frequency divider circuit (101), at a rising or falling edge of the input clock; a second flip-flop ($102_2$) for sampling the output of the first flip-flop at a rising or falling edge of the input clock; a first interpolator ($103_1$), to which outputs of the first and second flip-flops are input, for producing an output signal having a delay time decided by a time obtained by dividing the timing difference between the two outputs by a first interior-division ratio on the basis of the phase decision information; a third flip-flop ($102_3$) for sampling the clock, which has been frequency-divided by the frequency divider circuit, at a rising or falling edge of the output clock (the output of the first clock buffer); a fourth flip-flop ($102_4$) for sampling the output of the third flip-flop at a rising or falling edge of the output clock (the output of the first clock buffer ($6_1$); and a second interpolator ($103_2$), to which the outputs of the third and fourth flip-flops are input, for producing an output signal having a delay time decided by a time obtained by dividing the timing difference between the two outputs by a second interior-division ratio on the basis of the phase decision information.

Figure 18:
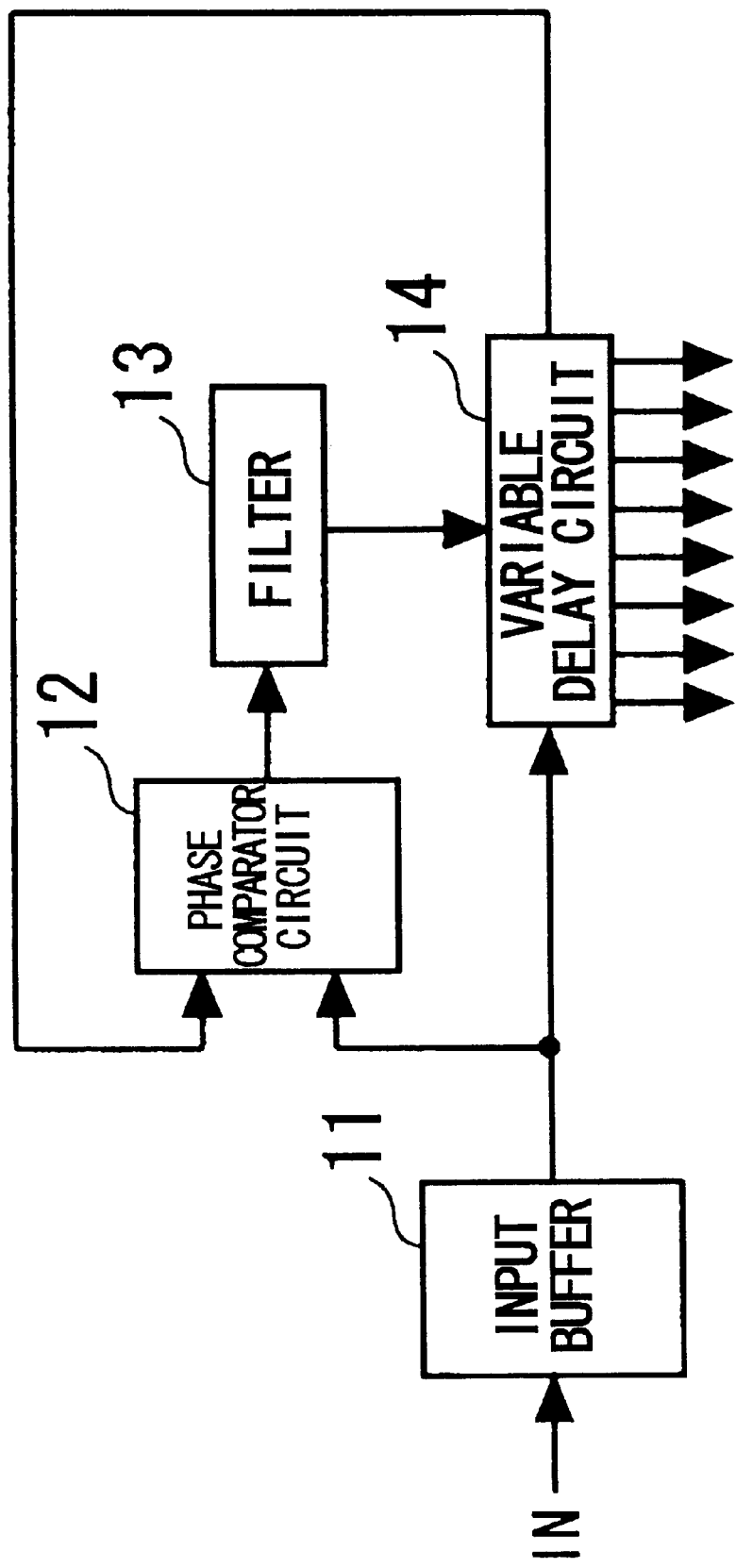
FIG. 18 is a diagram showing the structure of a clock control circuit using a DLL according to the prior art.
Figure 19:
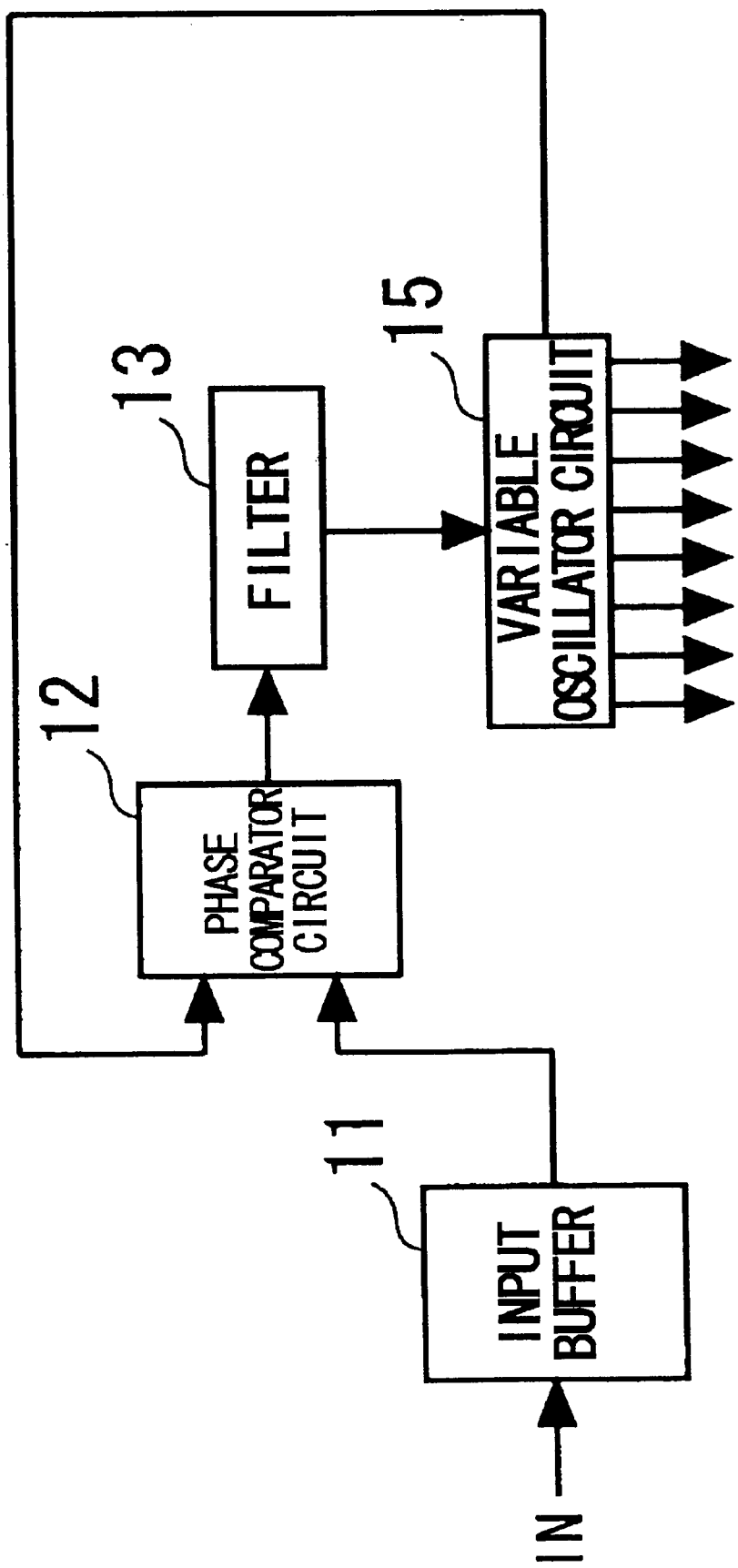
FIG. 19 is a diagram showing the structure of a clock control circuit using a PLL according to the prior art.

The present invention greatly reduces jitter components, which are caused by a feedback loop, in comparison with the conventional arrangements (see FIGS. 18 and 19) that produce multiphase clocks using a DLL circuit or the VCO of a PLL, and makes it possible to precisely generate and output a clock having a desired phase relationship with respect to an entered clock.

Embodiments of the present invention will be described in greater detail with reference to the drawings.

FIG. 1 is a block diagram illustrating the structure of a preferred embodiment of the present invention.

As shown in FIG. 1, an input clock IN that enters from a clock terminal is input to an input buffer 1. A clock control circuit according to this embodiment of the invention comprises: a multiphase clock generating circuit 2 for generating multiphase clocks from the clock that is output from the input buffer 1; a selector circuit 9, to which the multiphase clocks output from the multiphase clock generating circuit 2 are input, for selecting one of the multiphase clocks; a variable delay circuit $5_0$ for delaying the output of the selector circuit 9; a clock buffer dummy $6_0$, to which the output of the variable delay circuit $5_0$ is input, for driving a load dummy 8; a phase comparator circuit 3 for detecting a phase difference between an output from the multiphase clock generating circuit 2 and an output of the clock buffer dummy $6_0$; and a filter 4 for smoothing the output of the phase comparator circuit 3. The variable delay circuit $5_0$ has its delay time varied by the output of the filter 4. The clock control circuit further comprises a variable delay circuit $5_1$, to which the output of the input buffer 1 is input, having its delay time varied by the output of the filter 4, and a clock buffer 6, to which the output of the variable delay circuit $5_1$ is input.

The load dummy 8, which applies a load approximately equivalent to the loads of the clock buffers $6_1$, $6_2$, is connected to the clock buffer dummy $6_0$. The clock buffer dummy $6_0$ and the clock buffers $6_1$, $6_2$ preferably are identical in construction, have identical current drive capabilities and output signals at identical delay times to the loads of the identical value.

The clock control circuit further comprises: an adder circuit 7 for adding the output of the filter 4 and a set value (a voltage or a digital code) 13 input thereto; a variable delay circuit $5_2$, to which the output of the input buffer 1 is input, having its delay time varied by the output of the adder circuit 7; and a clock buffer $6_2$ to which the output of the variable delay circuit $5_2$ is input.

As long as the phase comparator circuit 3 detects and outputs the phase difference between its two inputs, any structure for the phase comparator circuit 3 may be adopted. A simple arrangement is to construct the phase comparator circuit 3 with a D-type flip-flop that samples a data signal fed to a data input terminal at a rising or falling edge of a sampling clock fed to a clock input terminal thereof. The output of the clock buffer dummy $6_0$ and the output of the multiphase clock generating circuit 2 or, conversely, the output of the multiphase clock generating circuit 2 and the output of the clock buffer dummy $6_0$, are fed to the data input terminal and clock input terminal, respectively, of this D-type flip-flop.

As long as the filter 4 smoothes the output of the phase comparator circuit 3, any structure for the filter 4 may be adopted. For example, the filter 4 is constituted by a charge pump, in which a capacitor is charged and discharged by the output of the phase comparator circuit 3, and a low-pass filter.

Figure 17:
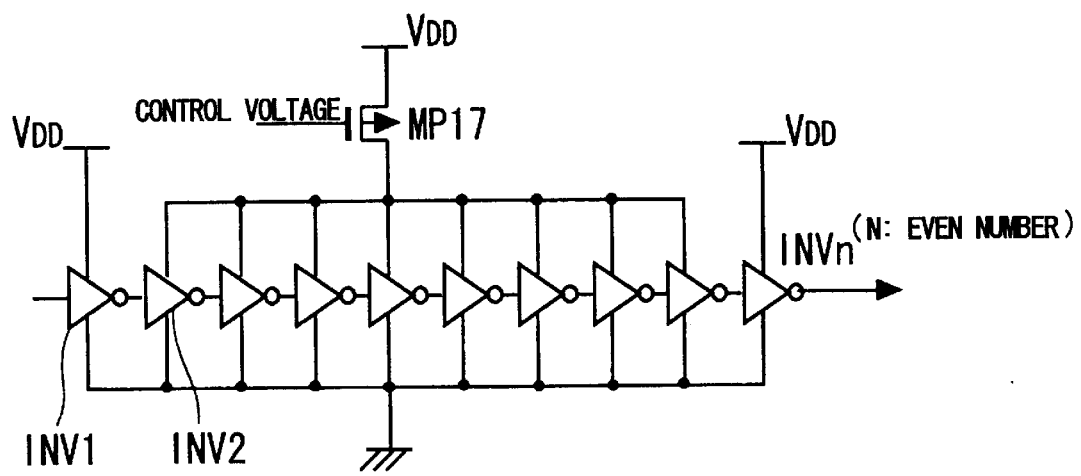
FIGS. 17a and 17b are diagrams showing two examples of structures of a variable delay circuit used in the embodiments of the present invention.
Figure 17:
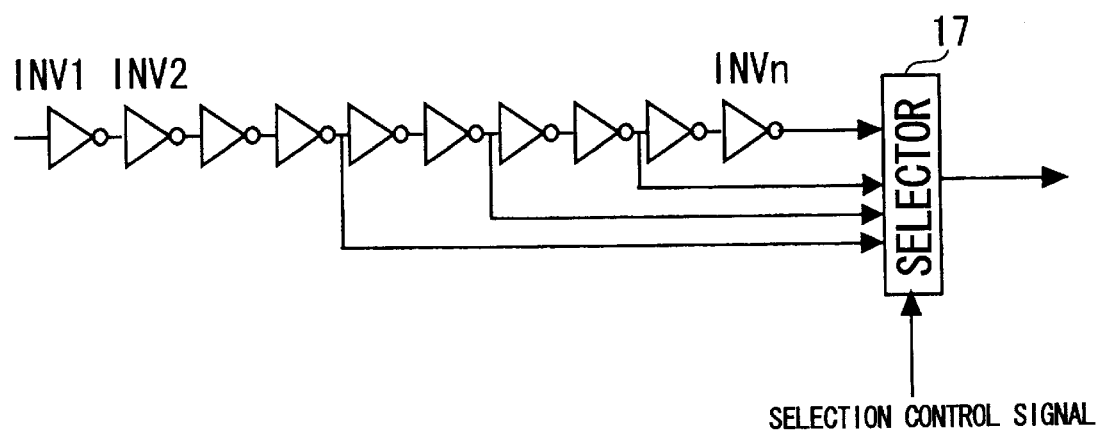

By way of example, as shown in FIG. 17a, each of the variable delay circuits $5_0$ to $5_2$ may have a CMOS inverter series (INV1 to INVn) to which a signal is input, and a transistor element MP17, which is inserted between the CMOS inverter series and a power supply, in which the resistance value of an ON resistor is varied by a control voltage applied to a gate terminal, and the resistance value of the transistor element MP17 can be varied by the control voltage to thereby vary the delay time of the CMOS inverter series. The structure of the circuit shown in FIG. 17a is such that power-supply voltage VDD is supplied without varying the voltage of the circuit in order to bring the amplitudes of the CMOS inverters of the initial and final stages of each variable delay circuit into conformity. A transistor element having the control voltage as its gate input may be inserted into the power-supply bus of each CMOS inverter.

Further, by way of example, the output of the filter 4 may be delivered as a digital signal (or the output voltage of the filter 4 may be converted to a digital signal by an A/D converter and the digital signal may be output), and as shown in FIG. 17b, each of the variable delay circuits $5_0$ to $5_2$ may be so adapted that a selector 17, to which the outputs of multiple stages of inverters are input, receives the output signal of the filter 4 as a selection control signal and selects the output of an inverter having the applicable delay time.

In a case where the adder circuit 7 is implemented by digital circuitry in the arrangement of FIG. 1, the output of the filter 4 and the set value 13 are made digital signals. If the adder circuit 7 is implemented by analog circuitry (a voltage adder), then the set value 13 is applied in the form of a voltage signal.

One clock signal of the multiphase clocks (clocks that make transitions at equally spaced phase differences obtained by equally diving the clock period tCK of the input clock) output from the multiphase clock generating circuit 2 is fed to the phase comparator circuit 3. The selector circuit 9 selects a signal having a prescribed phase difference with respect to this one clock signal. The delay time of the variable delay circuit $5_0$ is variably controlled in such a manner that the delay time of the variable delay circuit $5_0$ and clock buffer dummy $6_0$ will become equal to this phase difference. The structure of the multiphase clock generating circuit 2 will be described in detail later.

An output OUT1 of the clock buffer $6_1$ is a signal having a phase identical with that of the output of the clock buffer dummy $6_0$, and an output OUT2 of the clock buffer $6_2$ is a signal having a phase, with respect to the phase of the output of the clock buffer dummy $6_0$, that corresponds to a value obtained by adding the set value 13 (or subtracting the set value 13 if this value is negative) by the adder circuit 7.

The operation of the first embodiment of the invention shown in FIG. 1 will now be described.

The selector circuit 9 selects a clock (a clock having an ith phase), which ha s a prescribed phase relationship with respect to the clock supplied to the phase comparator circuit 3, from among the multiphase clocks output from the multiphase clock generating circuit 2. The phase comparator circuit 3 is controlled in such a manner that the delay time of the variable delay circuit $5_0$ and clock buffer dummy $6_0$ will become equal to this phase difference, the output OUT1 delivers a first clock signal having a desired phase difference with respect to the input clock, and the output OUT2 delivers a second clock signal having a desired phase difference with respect to the first clock signal output from the output OUT1. The selection made by the selector circuit 9 may be in response to a selection control signal from a CPU (not shown) or a selection control signal that is applied externally. For example, if the clock supplied to the phase comparator circuit 3 has a phase that lags by 90° the phase of the clock selectively output by the selector circuit 9, then feedback control is carried out in such a manner that the phase of the output signal of the clock buffer dummy $6_0$ and the phase of the clock supplied to the phase comparator circuit 3 will become equal.

Figure 2:
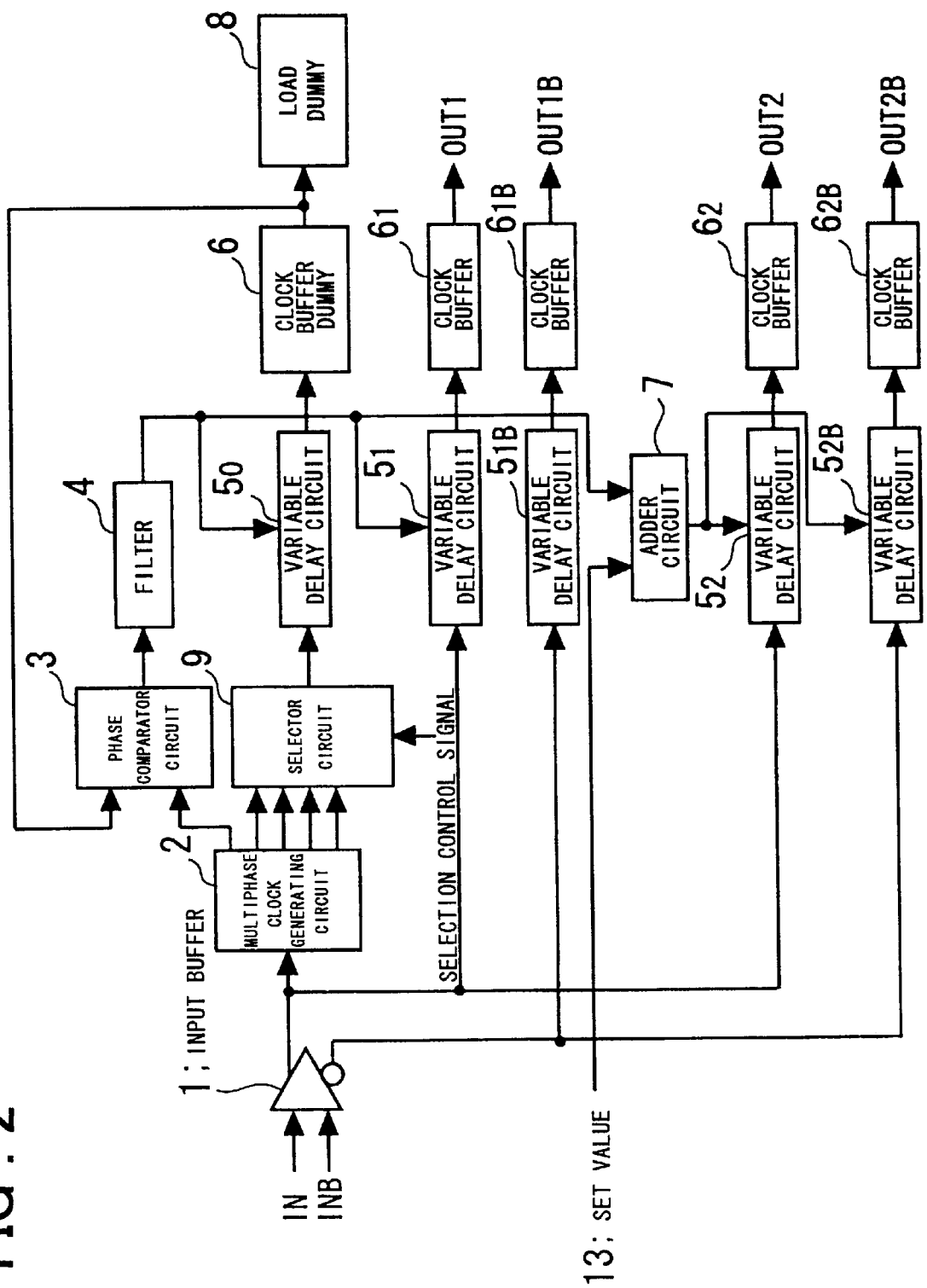
FIG. 2 is a diagram illustrating the structure of a modification of the first embodiment of the present invention.

FIG. 2 is a diagram illustrating the structure of a modification of the first embodiment of the present invention. In the example shown in FIG. 2, the clock is provided to the input buffer 1 in complementary fashion (as an in-phase (non-inverting-phase) and reverse phase(inverting-phase) signal pair), and the input buffer 1 delivers complementary clock signals (as non-inverting-phase and out-of-phase signal pair) as its outputs. These in-phase and reverse-phase clock signals are transmitted in an balanced-type differential mode. The variable delay circuit $5_1$ and clock buffer $6_1$ and the variable delay circuit $5_2$ and clock buffer $6_2$ are provided in regard to the in-phase signal, and a variable delay circuit $5_{1B}$ and a clock buffer $6_{1B}$ and a variable delay circuit $5_{2B}$ and a clock buffer $6_{2B}$ are provided with regard to the reverse-phase signal. The clock buffers $6_1$, $6_{1B}$ deliver mutually complementary output clocks OUT1, OUT1B having a first phase difference with respect to the input clock IN, and the clock buffers $6_2$, $6_{2B}$ deliver mutually complementary output clocks OUT2, OUT2B having a second phase difference (decided by the adder circuit 7) with respect to the input clock IN. This embodiment is preferable for the transmission of a high-speed clock.

FIG. 3 is a diagram illustrating a specific example of the structure of a 4-phase-clock frequency multiplier circuit for generating a 4-phase clock. This circuit is one example of the multiphase clock generating circuit 2 shown in FIGS. 1 and 2.

As shown in FIG. 3, the 4-phase-clock frequency multiplier circuit has a ¼ frequency divider 201 for frequency dividing an input clock 205 by four and outputting 4-phase clocks Q1 to Q4; 4-phase-clock frequency multiplier circuits [MPFD (MultiPhase Frequency Doubler)] $202_1$ to $202_n$ cascade-connected in n stages; a clock combiner circuit 203; and a period detection circuit 204. The 4-phase-clock frequency multiplier circuit $202_n$ of the final stage outputs 4-phase clocks Qn1 to Qn4 the frequencies of which have been multiplied by 2n. The number n of the 4-phase-clock frequency multiplier circuits is arbitrary. In operation of this 4-phase-clock frequency multiplier circuit, frequency multiplication is performed continuously by making the 4-phase clocks 8-phase clocks in each of the 4-phase-clock frequency multiplier circuits 202, and then restoring the 4-phase clocks. An arrangement may be adopted in which the 8-phase clocks generated by the 4-phase-clock frequency multiplier circuit $202_n$ of the final stage are output as is. The details will be described later.

Figure 4A:
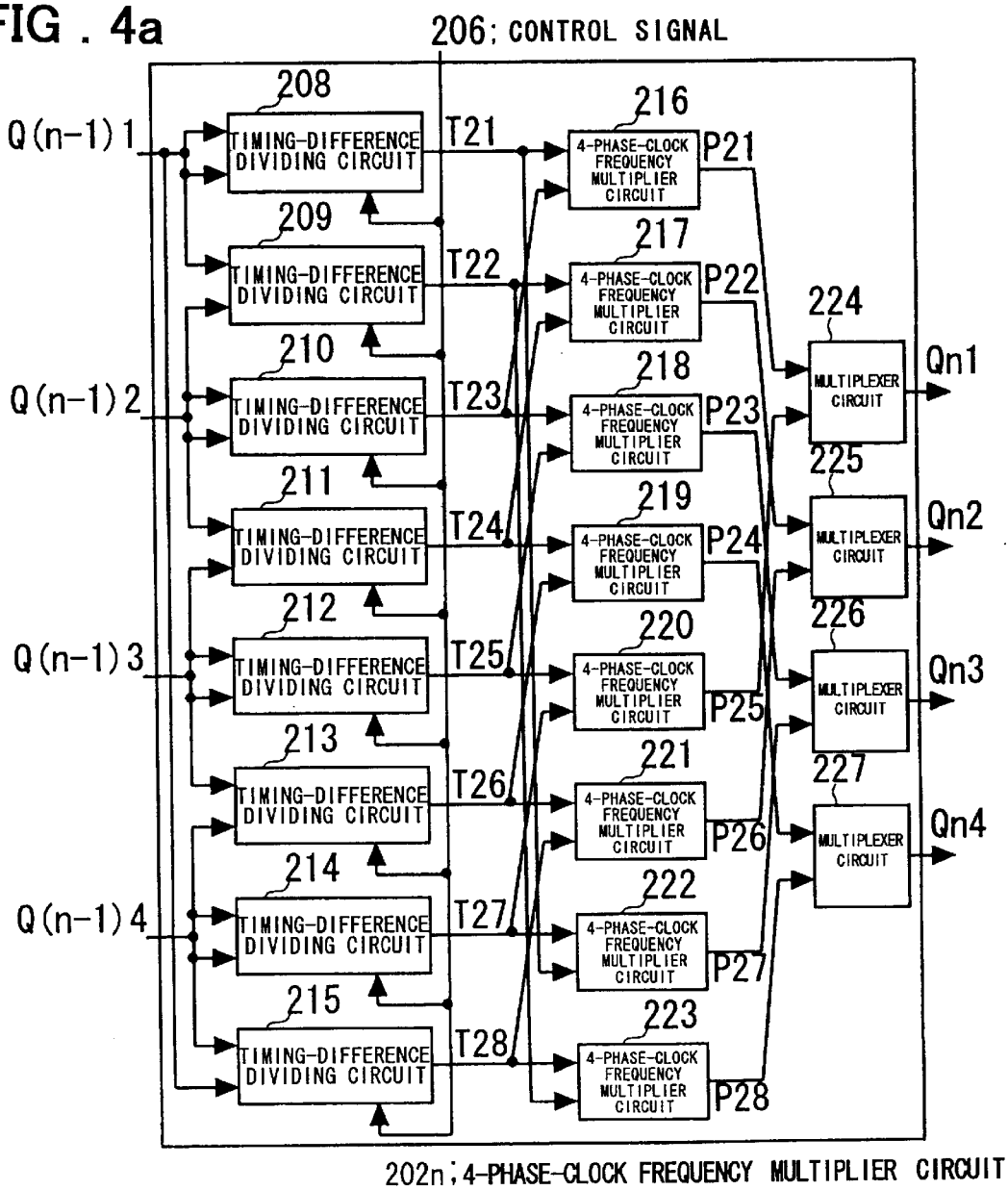
FIGS. 4a, 4b and 4c are diagrams illustrating the structure of a 4-phase-clock frequency multiplier circuit constructing the multiphase clock generating circuit according to the first embodiment of the present invention.
Figure 4B:
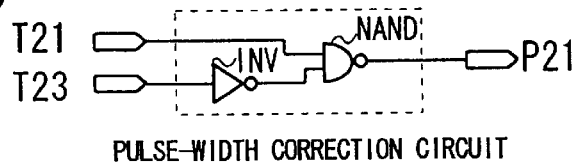
Figure 4C:
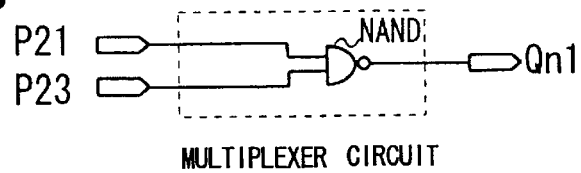

FIGS. 4a, 4b and 4c are diagrams illustrating an example of the structure of the 4-phase-clock frequency multiplier circuit 202n in a case where the multiphase clock generating circuit is implemented by 4-phase-clock frequency multiplier circuits. The 4-phase-clock frequency multiplier circuits $202_1$ to $202_n$ shown in FIG. 3 all have the same structure.

As shown in FIG. 4a, the 4-phase-clock frequency multiplier circuit $202_n$ includes eight timing-difference dividing circuits 208 to 215, eight pulse-width correction circuits 216 to 223 and four multiplexing circuits 224 to 227. FIG. 4b is a diagram showing the construction of a pulse-width construction circuit. The circuit comprises a NAND circuit the inputs to which are a first input T21 and a signal obtained by inverting a second input T23 by an inverter INV. FIG. 4c is a diagram showing the construction of a multiplexing circuit, which comprises a two-input NAND gate.

Figure 5:
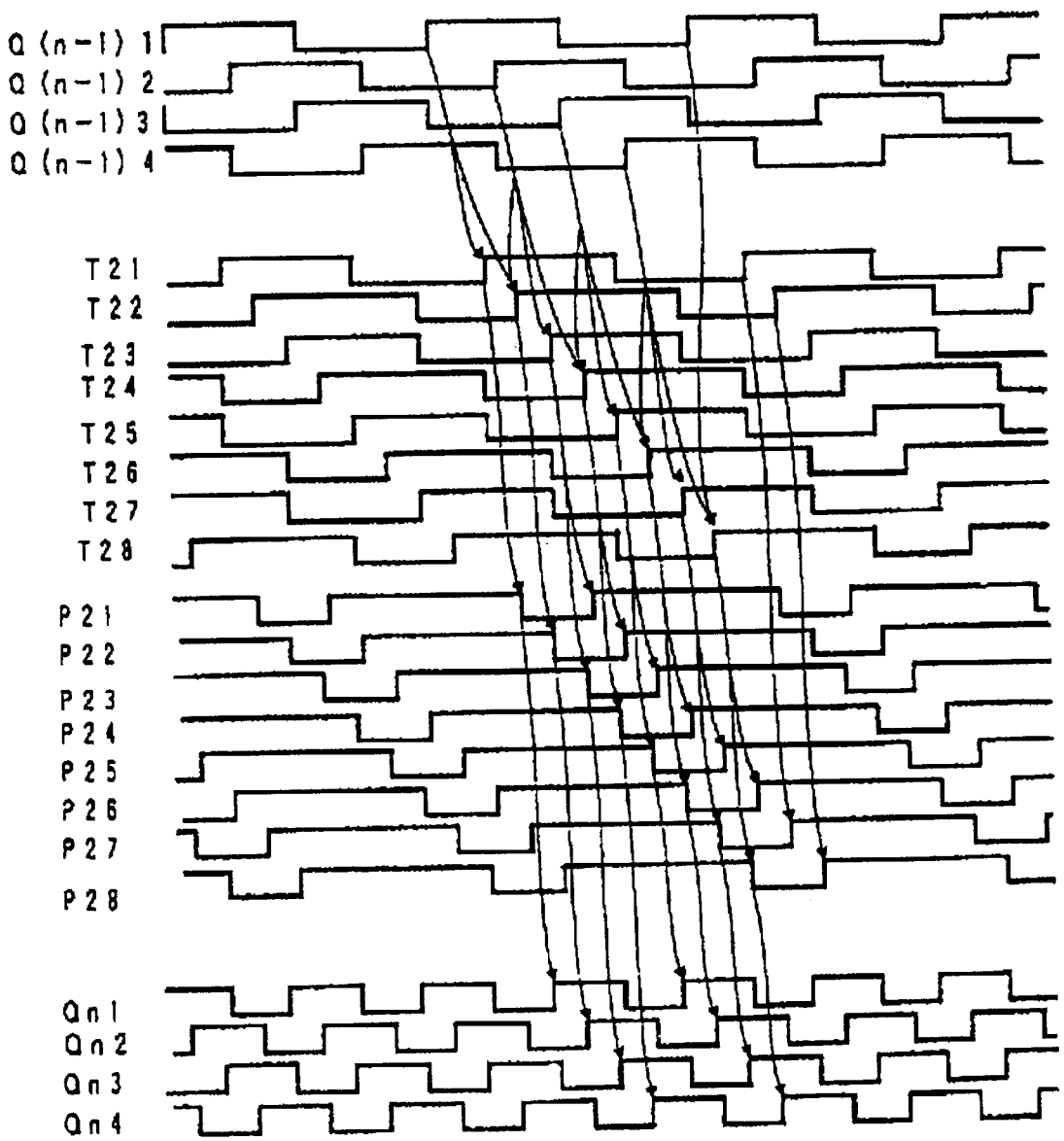
FIG. 5 is a diagram illustrating the timing operation of the 4-phase-clock frequency multiplier circuit according to the first embodiment of the present invention.

FIG. 5 is a signal waveform diagram showing the timing operation of the 4-phase-clock frequency multiplier circuit 202 depicted in FIG. 4. The rising edge of a clock T21 is decided by a delay, which is equivalent to the internal delay of the timing-difference dividing circuit 208, from the rising edge of a clock Q(n−1) 1; the rising edge of a clock T22 is decided by the timing division and internal delay of the timing-difference dividing circuit 209 that operates at the timing of the rising edge of clock Q(n−1) 1 and at the timing of the rising edge of clock Q(n−1) 2; and the rising edge of a clock T23 is decided by the timing division and internal delay of the timing-difference dividing circuit 210 that operates at the timing of the rising edge of clock Q(n−1) 1 and at the timing of the rising edge of clock Q(n−1) 2. Similarly, the rising edge of a clock T26 is decided by the timing division and internal delay of the timing-difference dividing circuit 213 that operates at the timing of the rising edge of clock Q(n−1) 3 and on the timing of the rising edge of clock Q(n−1) 4; the rising edge a clock T27 is decided by the internal delay of the timing-difference dividing circuit 214 that operates at the timing of the rising edge of a clock Q(n−1) 4; and the rising edge of a clock T28 is decided by the timing division and internal delay of the timing-difference dividing circuit 215 that operates at the timing of the rising edge of clock Q(n−1) 4 and at the timing of the rising edge of clock Q(n−1) 1.

The clocks T21 and T23 output from the timing-difference dividing circuits 208 and 210 are input to the pulse-width correction circuit 216. The latter outputs a pulse P21 having a falling edge decided by clock T21 and a rising edge decided by clock T23. Pulses P22 to P28 are generated through a similar procedure. The clocks P21 to P28 form an 8-phase pulse group of duty 25% in which the phases are shifted by steps of 45°. The clock P21 and the clock P25, whose phase has been shifted 180° relative to clock P21, are multiplexed and inverted by the multiplexing circuit 224 and output as clock Qn1 of duty 25%. Clocks Qn2 to Qn4 are generated in a similar manner. The clocks Qn1 to Qn4 form a 4-phase pulse group of duty 50% in which the phases a shifted by steps of 90°. In the process of generating the clocks Qn1 to Qn4 from the clocks Q(n−1) 1 to Q(n−1) 4, the frequency of the clocks Qn1 to Qn4 is doubled.

Thus, 8-phase clocks P21 to P28 are generated from the 4-phase clocks Q(n−1) 1 to Q(n−1) 4 and 4-phase clocks Qn1 to Qn4 of doubled frequency are generated. It should be noted that an arrangement may be adopted in which 8-phase clocks P21 to P28 are output from the 4-phase-clock frequency multiplier circuit $202_n$ of the final stage (see FIG. 3). (In this case, 8-phase clocks having equally spaced phase differences enter the selector circuit 9 of FIG. 1).

Figure 6A:
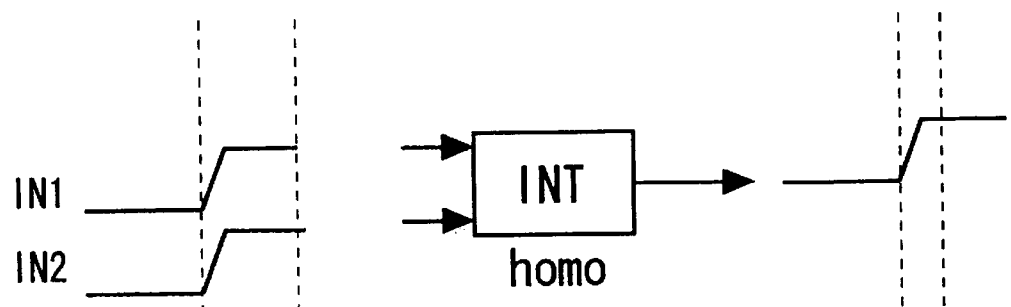
FIGS. 6a and 6b are diagrams useful in describing the operation of an interpolator in the 4-phase-clock frequency multiplier circuit according to the first embodiment of the present invention.
Figure 6B:
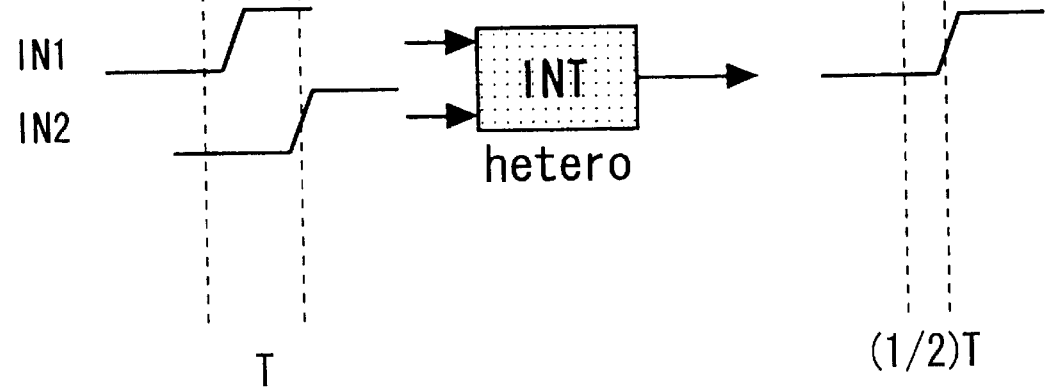

FIGS. 6a and 6b are diagrams schematically illustrating the principle of operation of the timing-difference dividing circuit 208, 209 shown in FIG. 4. Timing-difference dividing circuits 208, 210, 212, 214 (homo) the inputs to each of which are identical signals produce output signals with their own delay times. Timing-difference dividing circuits 209, 211, 213, 215 (hetero) the inputs to each of which are two signals having a phase difference T between them output signals with a delay time obtained by adding a time T/2, which is obtained by halving the phase difference T, to the delay time specific to the timing-difference dividing circuit.

Figure 7:
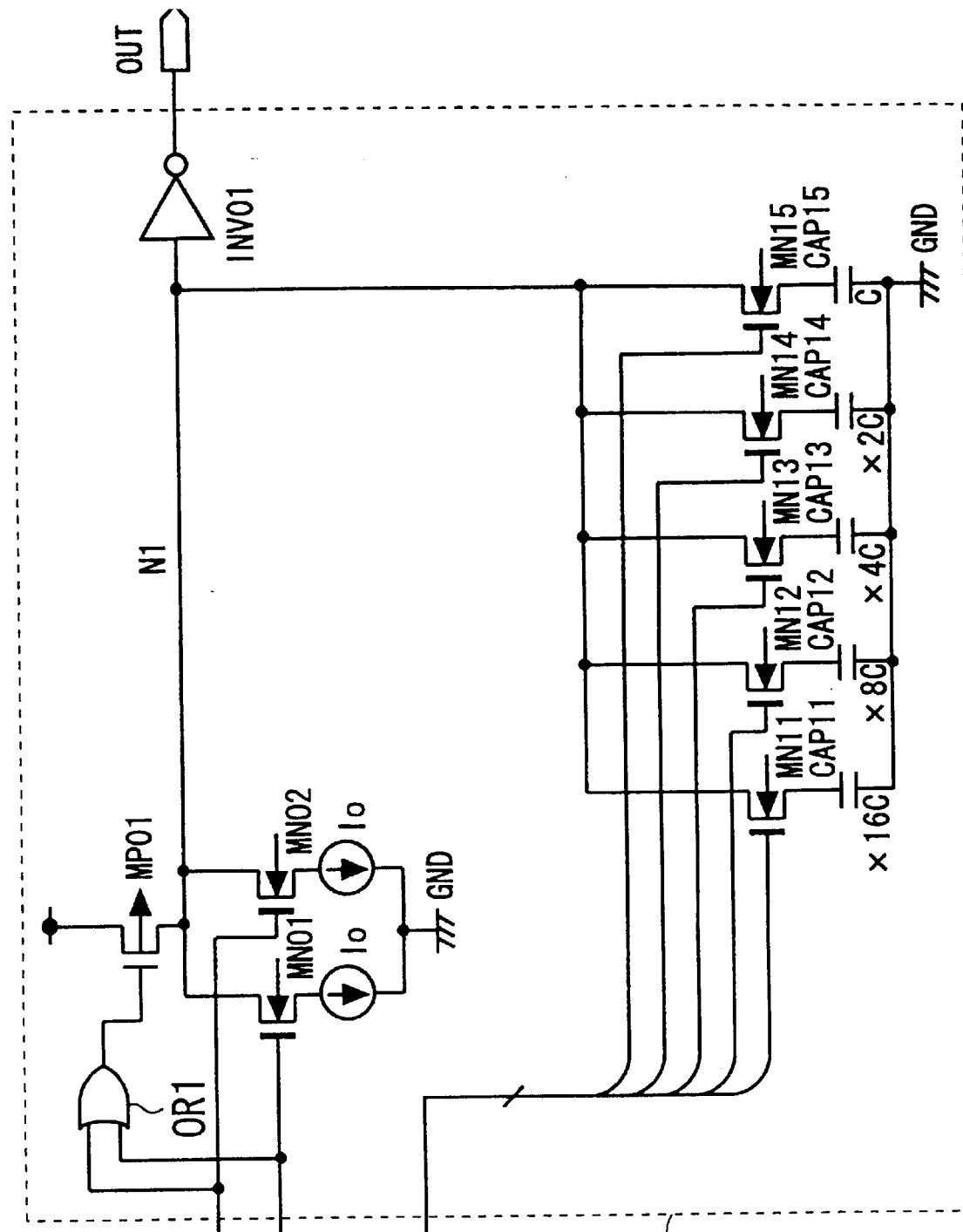
FIG. 7 is a diagram showing an example of the structure of the interpolator in the 4-phase-clock frequency multiplier circuit according to the first embodiment of the present invention.

FIG. 7 is a diagram showing an example of the structure of the timing-difference dividing circuits 208, 209 illustrated in FIG. 4. The timing-difference dividing circuit 208 has identical signals applied to its two inputs IN1, IN2, and the timing-difference dividing circuit 209 has two neighboring signals applied to its two inputs IN1, IN2. That is, the timing-difference dividing circuit 208 has identical inputs Q(n−1)1 applied to its input terminals IN1, IN2, and the timing-difference dividing circuit 209 has Q(n−1)1 and Q(n−1)2 applied to its input terminals IN1, IN2, respectively. There are provided a P-channel MOS transistor MP01 having its source connected to a power supply VDD and its drain connected to an internal node N1; an OR gate OR1 whose inputs are the input signal IN1, IN2 and whose output is connected to the gate of the P-channel MOS transistor MP01; and N-channel MOS transistors MN01, MN02 whose drains are connected to the internal node N1, whose sources are connected to ground via a constant-current source $I_0$ and to the gates of which the input terminals IN1, IN2 are connected. The internal node N1 is connected to the input terminal of an inverter INV01. A circuit comprising a serially connected N-channel MOS transistor MN11 and a capacitor CAP11, a circuit comprising a serially connected N-channel MOS transistor MN12 and a capacitor CAP12, . . . , and a circuit comprising a serially connected N-channel MOS transistor MN15 and a capacitor CAP15 are connected in parallel between the internal node N1 and the ground (GND). A control signal 206 having a five bits width output from the period detection circuit 204, which detects the period of the input clock, is connected to the gates of the N-channel MOS transistors MN11, MN12, . . . , MN15, whereby these transistors are turned on and off. The gate widths of the N-channel MOS transistors MN11, MN12, MN13, MN14, MN15 and the capacitances of the capacitors CAP11, CAP12, CAP13, CAP14, CAP15 are related as follows, by way of example, in terms of size ratio: 16:8:4:2:1. On the basis of control signal 206 output from the period detection circuit 204 (see FIG. 3), the load connected to the common node N1 is adjusted in 32 stages, whereby the clock period is set.

With regard to the timing-difference dividing circuit 208, the charge at the node N1 is extracted via the two N-channel MOS transistor of the NOR gates MN01, MN02 at the rising edge of the clock Q(n−1) 1 input to both of the inputs IN1, IN2. When the voltage level at the node N1 reaches the threshold value of the inverter INV01, the clock T21 at the output of the inverter INV01 begins to rise. Let CV represent the charge that requires to be extracted from the node N1 until the voltage of the node N1 reaches the threshold value of the inverter INV01 (where C denotes a capacitance value and V represents voltage), and let I represent the discharge current of the N-channel MOS transistors. The amount of charge CV is discharged at a constant current of current value 2I from the rising edge of the clock Q(n−1) 1. As a result, a time CV/2I represents the timing difference (propagation delay time) from the rising edge of clock Q(n−1) 1 to the rising edge of clock T21.

When the clock Q(n−1) 1 is at a low level, the P-channel MOS transistor MP01 is turned on, the node N1 is charged to the high level and the output clock T21 of inverter INV01 is at a low level.

With regard to the timing-difference dividing circuit 209, the charge at the internal node N1 is extracted in the period following time tCKn (where tCKn represents the clock period) from the rising edge of the clock Q(n−1) 1. When the voltage level at the node N1 reaches the threshold value of the inverter INV01, the clock T22 rises from the rising edge of the clock Q(n−1) 2. Let CV represent the charge at the node N1 and let I represent the discharge current of the N-channel MOS transistors. The amount of charge CV is discharged at a constant current of current value I over the length of time tCKn from the rising edge of the clock Q(n−1) 1 and is extracted at a constant current 2I over the remaining time. As a result, a time $$tCKn+(CV-tCKn\cdot I)/2I=CV/2I+tCKn/2 \qquad (1)$$

represents the timing difference between the rising edge of clock Q(n−1) 1 and the rising edge of clock T22.

In other words, the timing difference between the rising edges of clocks T22 and T21 is tCKn/2.

The clock T22 falls if both clocks Q(n−1) 1 and Q(n−1) 2 are both at a low level and the node N1 is charged to the high level from the power supply via the P-channel MOS transistor MP01. The above holds for clocks T22 to T28 as well so that the timing differences between the rising edges of the clocks T21 to T28 will each be tCKn/2.

The pulse-width correction circuits 216 to 223 generate the 8-phase pulse group P21 to P28 of duty 25% in which the phases are shifted by steps of 45° (see FIG. 4).

The multiplexing circuits 224 to 227 generate the 4-phase pulse group Qn1 to Qn4 of duty 50% in which the phases are shifted by steps of 90° (see FIG. 4).

The timing-difference dividing circuit shown in FIG. 7 may be well modified as appropriate depending upon the application in which it is used. For example, such an arrangement may be adopted in which the output signal of a NAND gate to which the first and second input signals IN1, IN2 are applied is connected to the gate of the P-channel MOS transistor MP01, and signals obtained by inverting the first and second input signals IN1, IN2 by inverters are input to the gates of the N-channel MOS transistors MN01, MN02 respectively. In this case, when the first and second input signals IN1, IN2 are at a high level, the P-channel MOS transistor MP01 turns on (conducts), the internal node N1 is charged and the output of the inverter INV01 switches to a low level. When either or both of the first and second input signals IN1, IN2 is at a low level, the P-channel MOS transistor MP01 turns off and either or both of the N-channel MOS transistors NM01, NM02 turns on to discharge the internal node N1. If the voltage level at the node N1 falls below the threshold value of the inverter INV01, the output of the inverter INV01 rises to a high level.

In the first embodiment of the present invention illustrated in FIGS. 1 and 2, the phase comparator circuit 3, filter 4, variable delay circuit $5_0$ and clock buffer dummy $6_0$ construct a control loop for generating a prescribed phase difference. Since in the signal path from the input buffer 1 is included no feedback loop, the clock outputs OUT1 (or OUT1 and OUT1B), OUT2 (or OUT2 and OUT2B) are free from jitter ascribable to a feedback loop and therefore are kept at a desired phase differences with respect to the input clock IN. In the embodiment of the present invention shown in FIGS. 1, and 2, it is of course permissible to adopt an interchanged arrangement in which one of the multiphase clocks output from the multiphase clock generating circuit 2 is input to the variable delay circuit $5_0$ and the output selected by the selector circuit 9 is supplied to the phase comparator circuit 3.

As for the generation of the phase difference, several arrangements are applicable in addition to the above-described arrangement of the multiphase clock generating circuit and selector circuit. A second embodiment of the invention having an interpolator-based phase-difference generating circuit will be described next.

Figure 8:
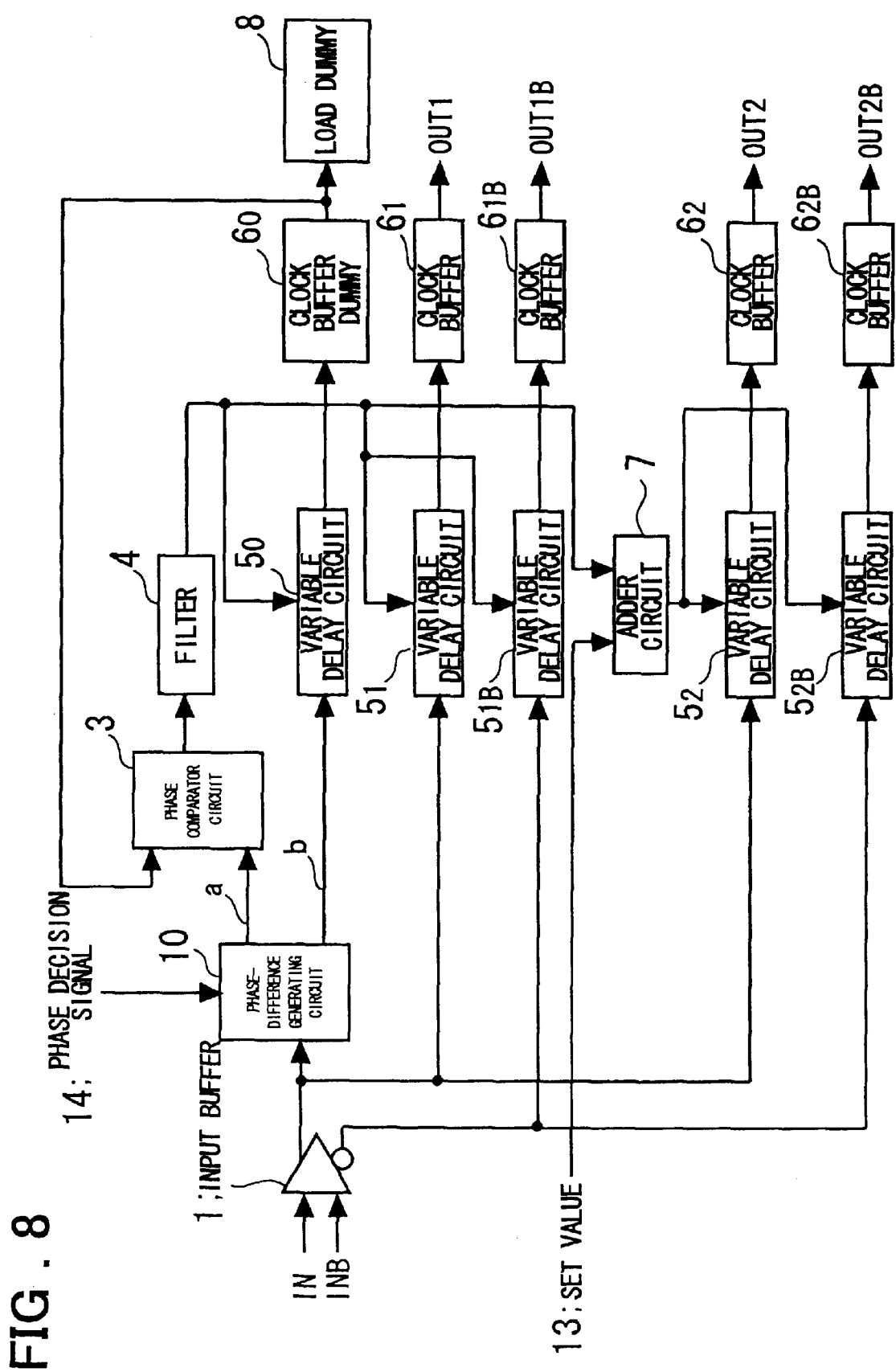
FIG. 8 is a block diagram illustrating the structure of a second embodiment of the present invention.

FIG. 8 is a block diagram illustrating the structure of a second embodiment of the present invention.

As shown in FIG. 8, a clock control circuit in accordance with the second embodiment of the invention comprises: a phase-difference generating circuit 10, to which the output signal of the input buffer 1 is provided, for outputting first and second signals a, b obtained by delaying the output signal of input buffer 1 by a predetermined phase difference on the basis of a phase decision information 14 received; the variable delay circuit $5_0$ for delaying the second output b of the phase-difference generating circuit 10; the clock buffer dummy $6_0$ for driving the output signal of the variable delay circuit $5_0$; the phase comparator circuit 3 for detecting a phase difference between the first output a of the phase-difference generating circuit 10 and the output signal of the clock buffer dummy $6_0$; and the filter 4 for smoothing the output signal of the phase comparator circuit 3. The variable delay circuit $5_0$ has its delay time varied by the output of the filter 4. The clock control circuit further comprises variable delay circuits $5_1$, $5_{1B}$, to which the complementary in-phase and reverse-phase outputs of the input buffer 1 are input, having their delay times varied by the output of the filter 4; the adder circuit 7 for adding the output signal of the filter 4 and the entered set value 13; variable delay circuits $5_2$, $5_{2B}$ to which the complementary in-phase and reverse-phase outputs of the input buffer 1 are input, having their delay times varied by the output of the adder circuit 7; and clock buffers $6_1$, $6_{1B}$ and $6_2$, $6_{2B}$ to which the outputs of the variable delay circuits $5_1$, $5_{1B}$ and variable delay circuits $5_2$, $5_{2B}$, respectively, are input. The load dummy 8, whose load is approximately equivalent to the loads of the clock buffers $6_1$, $6_{1B}$ and $6_2$, $6_{2B}$, is connected to the clock buffer dummy $6_0$. The clock buffer dummy $6_0$ and the clock buffers $6_1$, $6_2$ preferably are identical in construction, have identical current drive capabilities and output signals at identical delay times to the identical loads.

FIG. 9 is a diagram schematically illustrating an arrangement in which a clock is transmitted in single-ended mode rather than in a differential mode. The functions of the blocks in FIG. 9 are the same as those of the second embodiment described above.

The operation of the second embodiment of the invention shown in FIGS. 8 and 9 will now be described. Control is performed by the phase comparator circuit 3, filter 4 and variable delay circuit $5_0$ in such a manner that the delay time of the variable delay circuit $5_0$ and clock buffer dummy $6_0$ will become equal to the phase difference (e.g., about 90°) supplied from the phase-difference generating circuit 10 to the phase comparator circuit 3.

FIG. 10 is a diagram showing an example of the circuit structure of the phase-difference generating circuit 10 (see FIG. 9) in a second embodiment of the present invention. As shown in FIG. 10, the phase-difference generating circuit 10 comprises a frequency divider circuit 101 for frequency-dividing an input clock by eight; a first D-type flip-flop $102_1$ for sampling the frequency-divided clock output from the frequency divider circuit 101, with the input clock; a second D-type flip-flop $102_2$ for sampling the output A of the first D-type flip-flop with the input clock; a first interpolator (which is also referred to as a "fine adjusting interpolator") $103_1$, to which outputs A, B of the first and second flip-flops $102_1$, $102_2$ are input, for producing an output signal having a delay time decided by a time obtained by performing an interior division of the timing difference between the two outputs by a first interior-division ratio on the basis of a control signal S[0]; and a second interpolator (which is also referred to as a "coarse adjusting interpolator") $103_2$, to which outputs A, B of the first and second flip-flops $102_1$, $102_2$ are input, for producing an output signal having a delay time decided by a time obtained by performing an interior division of the timing difference between the two outputs by a second interior-division ratio on the basis of a control signal S[0:31]. It should be noted that the frequency divider circuit 101 is not limited to a circuit that frequency-divides the input-clock frequency by eight.

Figure 11:
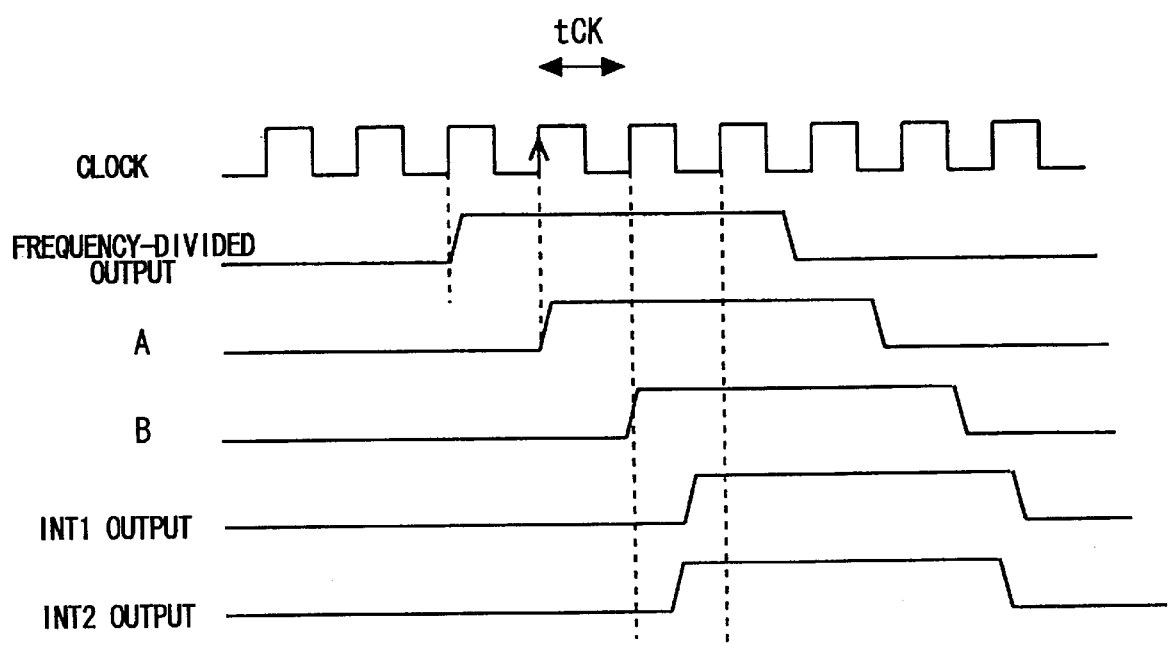
FIG. 11 is a diagram illustrating the timing operation of the phase-difference generating circuit according to the second embodiment of the present invention.

FIG. 11 is a timing diagram for describing the operation of the phase-difference generating circuit 10 shown in FIG. 10. The phase-difference generating circuit 10 generates output signals which include delay times obtained by performing an interior division, by the first and second interpolators $103_1$, $103_2$ on the basis of the control signals S[0], S[0:30], respectively, of the phase difference between the output A of the first flip-flop $102_1$ that samples the frequency-divided output of the frequency divider circuit 101 with the input clock and the output B of the second flip-flop $102_2$ that samples the output A of the first flip-flop $102_1$ with the input clock. In FIG. 11, INT1 output and INT2 output are the output signals of the first and second interpolators $103_1$, $103_2$.

Figure 16:
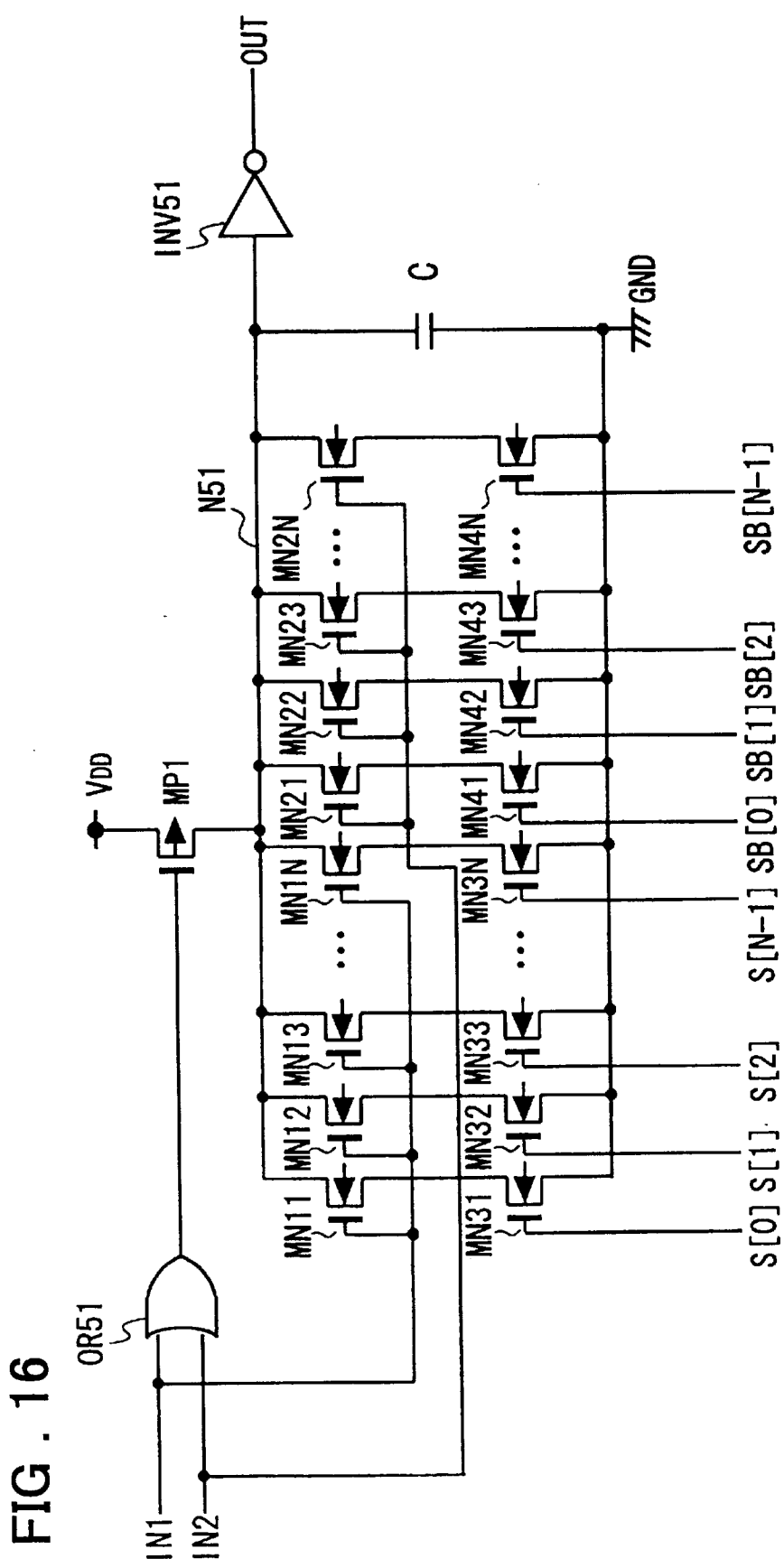
FIG. 16 is a diagram illustrating the structure of an interpolator in the phase-difference generating circuit according to the second and third embodiments of the present invention.

The first and second interpolators $103_1$, 1032 in FIG. 10 are identically constructed. FIG. 16 is a diagram illustrating an example of the structure of the first and second interpolators $103_1$, $103_2$. As shown in FIG. 16, the interpolator has a P-channel MOS transistor MP1 connected between a power supply VDD and an internal node N51 and turned on when an output signal from an OR gate OR51, to which the inputs IN1 and IN2 are provided, is at a low level; a capacitor C connected between the internal node N51 and ground; an inverter INV51 that has its input terminal connected to the internal node N51 and its output terminal from which an output signal OUT is output; 2N-number of mutually parallel-connected N-channel MOS transistors MN11 to MN1N, MN21 to MN2N having their drains connected to the internal node N51; and 2N-number of mutually parallel-connected N-channel MOS transistors MN31 to MN3N, MN41 to MN4N having their sources connected to ground. The input signal IN1 is connected in common to the gates of the N-pieces of N-channel MOS transistors MN11 to MN1N on one half side of the 2N-pieces of N-channel MOS transistors, and the input signal IN2 is connected in common to the gates of the N-pieces of N-channel MOS transistors MN21 to MN2N on the other half side of the 2N-pieces of N-channel MOS transistors.

A prescribed number of the N-channel MOS transistors MN31 to MN3N and of the N-channel MOS transistors MN41 to MN4N are turned on by control signals (N-bit control code) S[0] to S[N−1] and control signals (N-bit control code) SB[0] to SB[N−1] fed to the gates of the N-channel MOS transistors MN31 to MN3N, MN41 to MN4N. The N-bits control signals S[0: N−1], SB[0: N−1] constitute the phase decision signal 14 that is input to the phase-difference generating circuit 10, and SB[0] to SB[N−1] are of complementary signals obtained by inverting S[0] to S[N−1] by inverters. In FIG. 16, the positions of serially connected MOS transistors such as MN11 to MN1N and MN31 to MN3N may be interchanged and the positions of serially connected MOS transistors such as MN21 to MN2N and MN31 to MN3N may also be interchanged. For example, drain nodes of MOS transistors MN31 to MN3N and MOS transistors MN41 to MN4N may be connected in common to the internal node N51, source nodes of MOS transistors MN11 to MN1N and MOS transistors MN21 to MN2N may be connected in common to the GND and drain nodes of MOS transistors MN11 to MN1N and MOS transistors MN21 to MN2N are respectively connected to source nodes of MOS transistors MN31 to MN3N and MOS transistors MN41 to MN4N.

In FIG. 14, the control signal S[0:31] is input to the interpolator $103_1$ and is fed to the gates of the N-channel MOS transistors MN31 to MN3N (where N is 32) of FIG. 16. Each bit signal of SB[0:31] is a signal obtained by inverting each bit signal of the control signal S[0:31] by inverters (not shown). These signals are fed to the gate terminals of the N-channel MOS transistors MN41 to MN4N (where N is 32) in FIG. 16. Further, the control signal S[0] are input to the interpolator $103_2$. A signal obtained by inverting the bit of the control signal S[0] is input to the gate terminal of the N-channel MOS transistor MN41. The N-channel MOS transistors MN32 to MN3N have been set to off states (the gate terminals are fixed at a low level), and the N-channel MOS transistors MN41 to MN4N (where N is 32) have been set to on states (the gate terminals are fixed at a high level).

The operation of the interpolators will be described with reference to FIG. 16.

When the inputs IN1, IN2 are at a low level, the P-channel MOS transistor MP1, to the gate of which the output signal of the OR gate 51 is input, turns on so that the capacitor C is charged by a current from the power supply.

When the signal applied to the input terminal IN1 rises from a low level to a high level, the N-channel MOS transistors MN11 to MN1N turn on so that the electric charge that has been accumulated in the capacitor C is partially discharged via the path of n-pieces of N-channel MOS transistors, which have been turned on by the control signals, among the N-channel MOS transistors MN31 to MN3N whose drains are connected respectively to the sources of the N-channel MOS transistors MN11 to MN1N, whose sources are connected to ground and to the gates of which the control signals S[0] to S[N−1], respectively, are provided.

When the input signal IN2 rises from a low level to a high level upon a delay equivalent to the period (tCK) of the input clock from the rising edge of the input signal IN1, the N-channel MOS transistors MN21 to MN2N turn on so that the electric charge that has been accumulated in the capacitor C is discharged via the path of (N−n)-pieces of N-channel MOS transistors, which have been turned on by the control signals, among the N-channel MOS transistors MN41 to MN4N whose drains are connected to the sources of the N-channel MOS transistors MN21 to MN2N, whose sources are connected to ground and to the gates of which the control signals SB[0] to SB[N−1], respectively, are input.

Let CV represent the electric charge that is discharged by the time the output of the inverter INV51, the input to which is the terminal voltage of the capacitor C, switches to a high level. The electric charge is discharged by a current nI for the duration of the phase difference (T) from the moment the input IN makes a transition to a high level, and then is discharged by a drain current NI of a total of N-number of N-channel MOS transistors composed of n-number of N-channel MOS transistors MN11 to MN1n and (N−n)-number of N-channel MOS transistors MN21 to MN2(N−n). The delay time from the rising edge of the input IN from a low level to a high level to the rising edge of the output OUT is expressed as follows:

$$(CV-n\cdot I\cdot T)/NI32 \ CV/NI-n\cdot T/N \quad (2)$$

The delay time can be varied in units of the phase difference between inputs IN1 and IN2 divided by N.

With regard to the control signals applied to the interpolator $103_1$ in FIG. 14, assume that control signal S[0] is at a high level, that control signals S[1] to S[31] are at a low level, that control signal SB[0] is at a low level and that control signals SB[1] to SB[31] are at a high level.

The delay time of interpolator $103_1$ is $$CV/(32I)-tCK/32$$

because phase difference T=tCK, N=32 and n=1 hold in Equation (2) above.

The control signal (codes) S[0:31] set as the phase decision information 14 is applied to the interpolator $103_2$. Assume that the control signal S[0: i−1] is at a high level, that S[i] to S[31] are at a low level (where i is an integer equal to or greater than 2 and less than 31), that the control signal SB[0: i−1] is at a low level and that SB[i] to SB[31] are at a high level.

More specifically, if N=32, n=i hold in the above expression (2), then the delay time of the interpolator $103_2$ will be $$CV/(32I)-itCK/32$$

and the phase of the output INT2 of the interpolator $103_2$ will lead the phase of the output INT1 of interpolator $103_1$ by $$(i-1)tCK/32 \quad (3)$$

The output INT1 of interpolator $103_1$ is supplied to the phase comparator circuit 3 and the output INT2 of interpolator $103_2$ is supplied to the variable delay circuit $5_0$.

Figure 12:
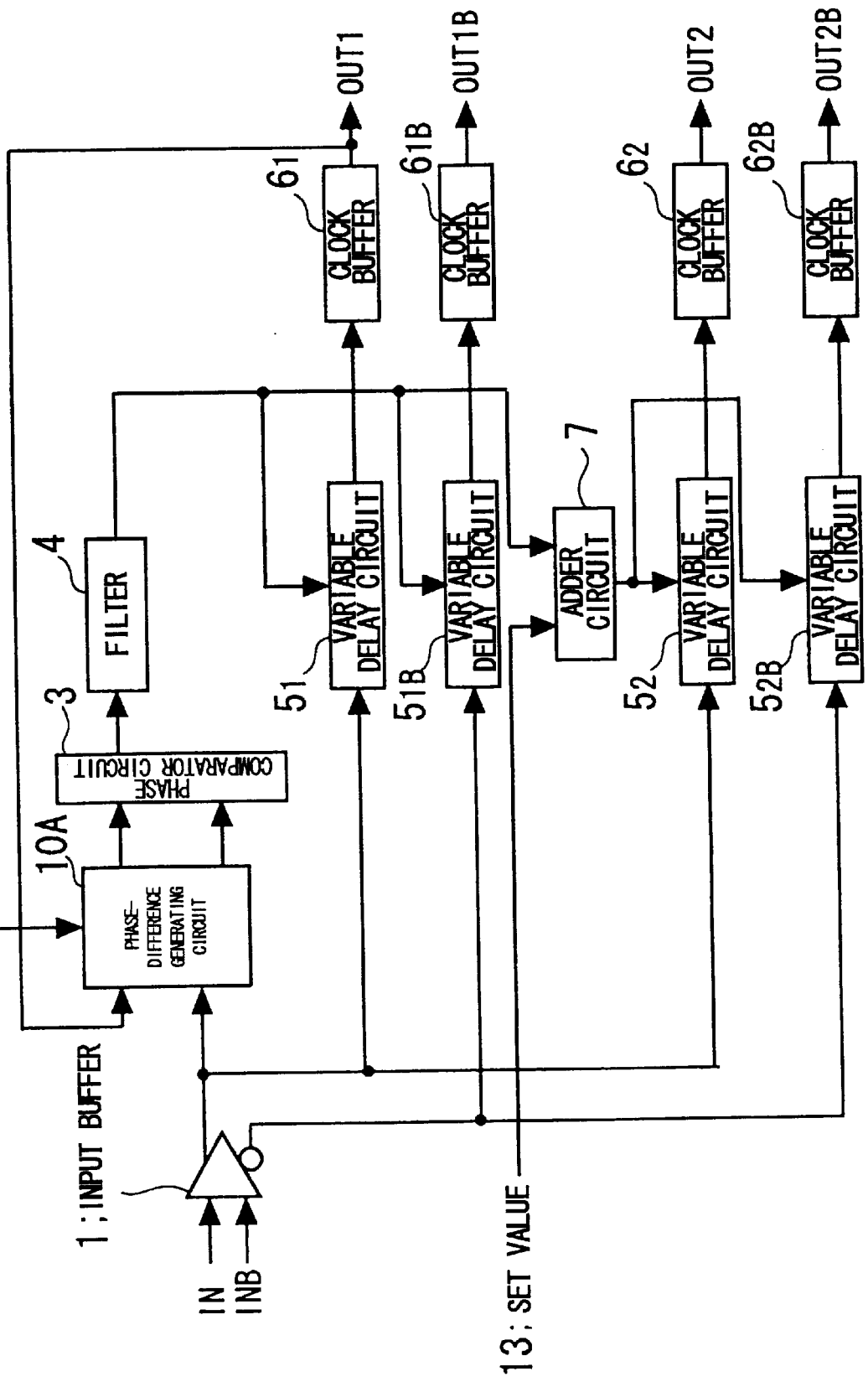
FIG. 12 is a block diagram illustrating the structure of a third embodiment of the present invention.

A third embodiment of the present invention will now be described. FIG. 12 is a diagram showing the structure of the third embodiment of the invention. As shown in FIG. 12, the third embodiment of the invention comprises: a phase-difference generating circuit (10A), to which an output signal of the input buffer 1 and an output signal of the clock buffer $6_1$ are input, for outputting two signals having a desired phase difference between them from the output (in-phase output) of the input buffer 1 and the output of the clock buffer $6_1$ on the basis of the phase decision information 13; the phase comparator circuit 3 for comparing the phases of the two outputs of the phase-difference generating circuit 10A; a filter 4 for smoothing the output of the phase comparator circuit 3; variable delay circuits $5_1$, $5_{1B}$ for delaying in-phase and reverse-phase complementary outputs, respectively, of the input buffer 1; and clock buffers $6_1$, $6_{1B}$ for driving the outputs of the variable delay circuits $5_1$, $5_{1B}$. The output signal of the filter 4 is fed to the variable delay circuits $5_1$, $5_{1B}$ as a control signal. The embodiment further comprises variable delay circuits $5_2$, $5_{2B}$ for delaying in-phase and reverse-phase complementary outputs, respectively, of the input buffer 1; clock buffers $6_2$, $6_{2B}$ for driving the outputs of the variable delay circuits $5_1$, $5_{1B}$; and adder circuit 7 for outputting a value, which is obtained by adding the output of the filter 4 and the specified value(set value) 13, to the clock buffers $6_1$, $6_{1B}$ for driving the outputs of the variable delay circuits $5_2$, $5_{2B}$ as a control signal.

FIG. 13 is a diagram schematically illustrating an arrangement in which the complementary clock outputs of the input buffer 1 are transmitted in single-ended mode rather than in a differential mode. The blocks in FIG. 13 are similar to those shown in FIG. 12.

FIG. 14 is a diagram showing the structure of the phase-difference generating circuit 10A (see FIGS. 12, 13) in the third embodiment of the present invention. As shown in FIG. 14, the phase-difference generating circuit 10A comprises the frequency divider circuit 101 for frequency-dividing an input clock by eight; the first D-type flip-flop $102_1$ for sampling the frequency-divided clock by the frequency divider circuit 101 with the input clock; the second D-type flip-flop $102_2$ for sampling the output A of the first D-type flip-flop $102_1$ with the input clock; the first interpolator $103_1$, to which outputs A, B of the first and second flip-flops $102_1$, $102_2$ are input, for producing an output signal having a delay time decided by a time obtained by performing an interior division of the timing difference between the two outputs by a first interior-division ratio on the basis of a control signal (control code) S[0:31] constituting the phase decision information 14; a third D-type flip-flop $102_3$ for sampling the clock, which has been frequency-divided by the frequency divider circuit 101, at the output of the clock buffer $6_1$; a fourth D-type flip-flop $102_4$ for sampling the output C of the third D-type flip-flop $102_3$ at the output of the clock buffer $6_2$; and a second interpolator $103_2$, to which outputs C, D of the third and fourth flip-flops $102_3$, $102_4$ are input, for producing an output signal having a delay time decided by a time obtained by performing an interior division of the timing difference between the two outputs by a second interior-division ratio on the basis of a control signal (control code) S[0] constituting the phase decision information 14.

Figure 15:
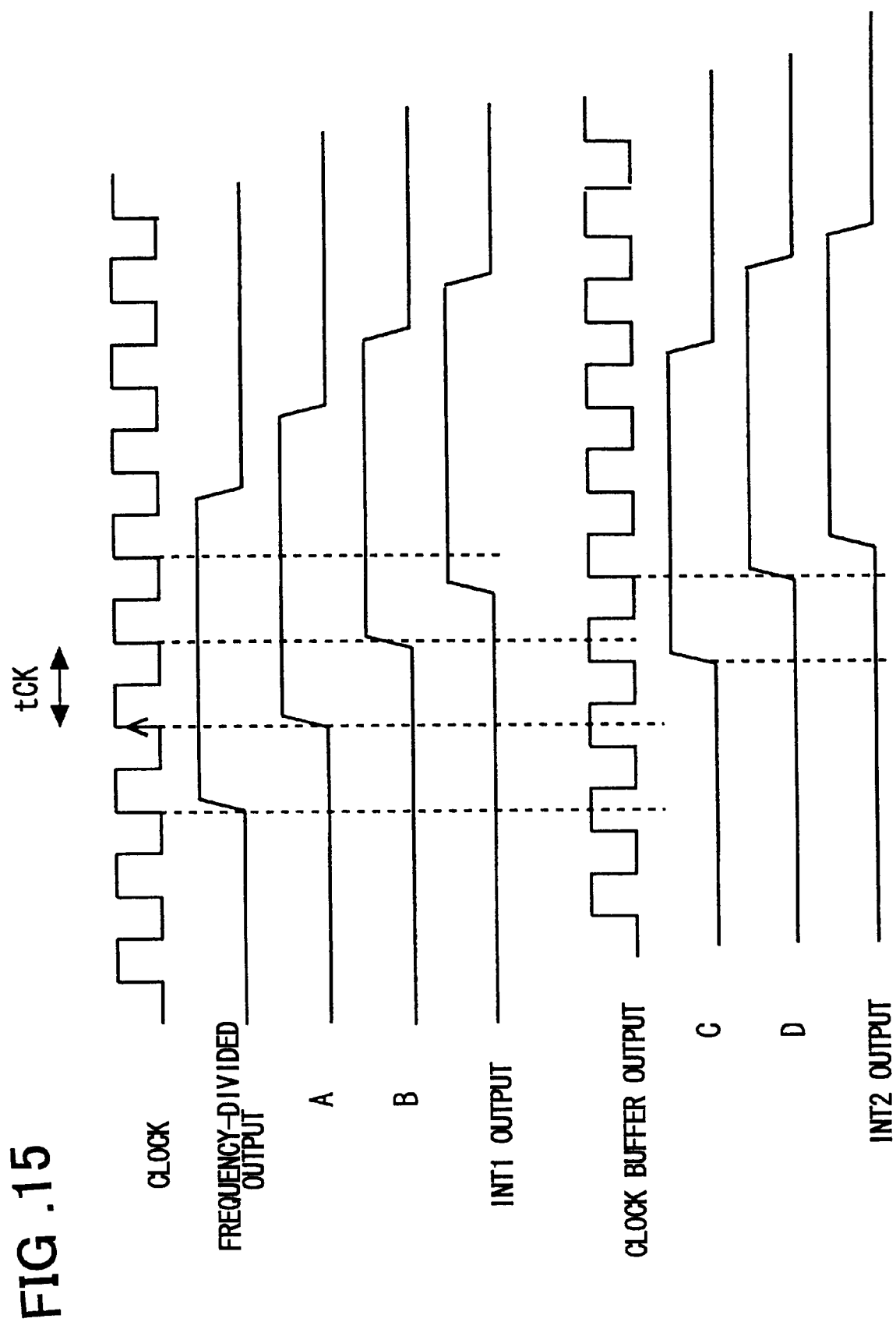
FIG. 15 is a diagram illustrating the timing operation of the phase-difference generating circuit according to the third embodiment of the present invention.

FIG. 15 is a timing diagram for describing the operation of the phase-difference generating circuit 10A. The first flip-flop $102_1$ samples the frequency-divided output signal of the frequency divider circuit 101 with the input clock and outputs the sampled signal (output A), and the second flip-flop $102_2$ samples the output A of the pointing device 102a with the input clock and outputs the sampled signal (output B). The outputs A, B of the first and second flip-flops $102_1$, $102_2$ are fed to the first interpolator $103_1$. The first interpolator $103_1$ produces an output signal (INT1 output) having a delay time obtained by performing an interior division of the phase difference between the two outputs A, B with the interior division ratio prescribed by the control signal S[0:31]. The third flip-flop $102_3$ samples the frequency-divided output signal of the frequency divider circuit 101 with the output clock of the clock buffer $6_1$ and outputs the sampled signal (output C), and the fourth flip-flop $102_4$ samples the output C of the third flip-flop ($102_3$) with the output clock of the clock buffer $6_1$ and outputs the sampled signal (output D). The outputs C, D of the third and fourth flip-flops $102_3$, $102_4$ are fed to the second interpolator $103_2$. The second interpolator $103_2$ produces an output signal (INT2 output) having a delay time obtained by performing an interior division of the phase difference between the two outputs C, D with the interior division prescribed by the control signal S[0]. In this example, after the INT1 output makes a rise transition, the INT2 output makes a rise transition. The phase comparator circuit 3 (see FIGS. 12, 13) have the two outputs INT1, INT2 applied thereto as inputs and varies the delay time of the variable delay circuit $5_1$ by feedback control of the filter 4, variable delay circuit $5_1$ and clock buffer $6_1$ so that control is performed in such a manner that the phase difference between two inputs of the phase comparator circuit 3 will become zero. The interpolators $103_1$, $103_2$ in FIG. 14 have a circuit structure similar to that shown in FIG. 16 and a description of this structure therefore is omitted.

As long as the filter 4 in the above-described embodiments is a circuit that smoothes the result of detecting the phase difference from the phase comparator circuit 3, it may be a low-pass filter comprising a capacitor and resistor constructing a charge pump with the voltage signal being supplied to the variable delay circuits and adder. In this case the set value 13 would be applied in the form of a voltage signal. Alternatively, the filter 4 may be so adapted that a signal obtained by smoothing the output of the charge pump is output upon being converted to a digital signal by an A/D converter. In this case, the set value 13 would be applied in the form of a digital signal. Further, the filter 4 may be implemented by a digital filter that smoothes the output of the phase comparator circuit 3.

The clock control circuit in each of the foregoing embodiments generates a signal of a desired phase difference from an input clock using a multiphase clock generating circuit or phase-difference generating circuit and performs control in such a manner that the phase difference between this signal and the output will become zero in a phase comparator. This simplifies the circuit arrangement. In comparison with the conventional arrangement (see FIGS. 18, 19) that generates multiphase clocks from a DLL circuit or from the VCO of a PLL circuit, jitter can be reduced by a wide margin and a clock having a desired phase relationship with respect to the input clock can be generated and output precisely.

The clock control circuit of the present invention is ideal for use in a clock control circuit of a semiconductor integrated circuit (LSI chip) to which an external clock is applied from an input buffer for generating an internal clock and supplying the internal clock to an internal synchronizing circuit, a clock recovery circuit from generating, from an input clock one or a plurality of clocks having a prescribed phase with respect to the input clock, or a signal generating circuit to which a reference signal is input for generating one or a plurality of signals having any phase relationship with respect to the reference signal. Though the present invention has been described in accordance with the foregoing embodiments, the invention is not limited to these embodiments and it goes without saying that the invention covers various modifications and changes that would be obvious to those skilled in the art within the scope of the claims.

The meritorious effects of the present invention are summarized as follows.

In accordance with the present invention, as described above, a signal having a desired phase difference is generated from an input clock by a multiphase clock generating circuit or phase-difference generating circuit, and feedback control is performed in such a manner that the phase difference between this signal and the output of a variable delay circuit will become zero. As a result, an output signal having a desired phase with respect to an input clock can be generated accurately.

Further, in accordance with the present invention, multiphase clocks are generated, from a signal obtained by a frequency-divided input clock, with a timing-difference dividing circuit in a multiphase clock generating circuit, or a signal having a desired phase difference is generated using an interpolator in a phase-difference generating circuit on the basis of a signal obtained by frequency-dividing the input clock. This makes it possible to extract a desired phase difference more precisely in comparison with the conventional arrangement in which multiphase clocks are extracted from a DLL circuit or VCO of a PLL, etc.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items might fall under the modifications aforementioned.

What is claimed is:

1. A clock control circuit comprising:
   a multiphase clock generating circuit, receiving a clock signal input thereto, for generating and outputting a plurality of clocks, phases of which differ from one another;
   a selector circuit, receiving a plurality of clocks output from said multiphase clock generating circuit, for selecting as an output signal one of the clocks received;
   a phase comparator circuit for detecting and outputting a phase difference between an output signal obtained by delaying the output signal of said selector circuit through a first variable delay circuit and one of the clocks output from said multiphase clock generating circuit;
   a filter for smoothing a phase difference detection signal output from said phase comparator circuit, an output signal of said filter being supplied to said first variable delay circuit for varying a delay time thereof; and
   a second variable delay circuit, a delay time thereof varied by the output signal of said filter,
   wherein a signal obtained by delaying the input clock signal through said second variable delay circuit is delivered as an output clock.

2. The clock control circuit as defined in claim 1, wherein said multiphase clock generating circuit comprises:
   a frequency divider circuit for frequency-dividing an input clock signal to generate and output a plurality of clock signals, phases of which differ from one another;
   a period detection circuit for detecting a period of the input clock signal; and
   one or a plurality of cascade-connected multiphase-clock frequency multiplier circuits, receiving clock signals with a plural number (n) of phases output from said frequency divider circuit as inputs, for generating clock signals, obtained on frequency multiplying the clock signals received;

said multiphase-clock frequency multiplying circuit comprising:
   2n-number of timing-difference dividing circuits, receiving n-phase clocks (first to nth clocks) as inputs, for outputting signals obtained by dividing a timing difference between two inputs thereto, wherein the timing-difference dividing circuit of odd number [(2I)th, where $1 \leq I \leq n$] receives Ith identical clocks input thereto, as said two inputs, from among the n-phase clocks, and timing-difference dividing circuit of even number [(2I)th, where $1 \leq I \leq n$] receives an Ith clock and an (I+1)th clock [where the (n+1)th clock is the first clock) input thereto from among the n-phase clocks;
   2n-number of pulse-width correction circuits, wherein a Jth (where $1 \leq J \leq 2n$) pulse-width correction circuit receives, as a first input, the output of a Jth timing-difference dividing circuit and, as a second input, the output of a (J+2 mod n)th (where J+2 mod n is the remainder obtained by dividing J+2 by n) timing-difference dividing circuit, and outputs a result of NAND operation of the first input and a signal obtained by inverting the second input; and
   n-number of multiplexing circuits, where a Kth (where $1 \leq K \leq n$) multiplexing circuit receives as inputs the output of a Kth pulse-width correction circuit and the output of a (K+n)th pulse-width correction circuit and outputs a result of NAND operation of the two inputs.

3. The clock control circuit as defined in claim 2, wherein each of said timing-difference-dividing circuits comprises:
   a logic circuit, to which signals that enter from first and second input terminals are fed, for outputting a result of a predetermined logical operation between the first and second input signals;
   a first switch element connected between a first power supply and an internal node and having an output signal of said logic circuit input to a control terminal thereof;
   a buffer circuit having an input terminal connected to the internal node for switching an output logic value if a magnitude relationship between a voltage level of the internal node and a threshold value reverses;
   a second switch element, which is turned on and off on the basis of a signal from the first input terminal, connected between the internal node and a second power supply; and
   a third switch element, which is turned on and off on the basis of the a signal from the second input terminal, connected between the internal node and the second power supply;
   a plurality of series circuits, each comprising a fourth switch element and capacitor, said series circuits connected in parallel between the internal node and the second power supply;
   each of said switch elements being turned on and off by a period control signal, which is supplied to a control terminal of said fourth switch element, whereby a capacitance value of capacitor connected to the internal node is decided.

4. A clock control circuit comprising:
   an input buffer receiving a clock signal input thereto;
   a multiphase clock generating circuit, receiving an output signal of said input buffer, for generating and outputting a plurality of clocks, phases of which differ from one another;

a selector circuit, receiving a plurality of clocks output from said multiphase clock generating circuit, for selecting and outputting one of the received clocks;

a first variable delay circuit for delaying an output signal of said selector circuit;

a first clock buffer receiving an output signal of said first variable delay circuit;

a phase comparator circuit for detecting and outputting a phase difference between one of the clocks output from said multiphase clock generating circuit and an output signal of said first clock buffer;

a filter for smoothing a phase-difference detection signal output from said phase comparator circuit, a delay time of said first variable delay circuit varied by the output signal of said filter;

a second variable delay circuit receiving the output signal of said input buffer and delaying said signal received, a delay time of said second variable delay circuit varied by the output signal of said filter; and a second clock buffer receiving the output signal of said second variable delay circuit for outputting an output clock signal.

5. The clock control circuit as defined in claim 4, wherein a pair of mutually complementary clocks are output from said input buffer, and a set of said second variable delay circuit and said second clock buffer is provided for each clock of the pair of complementary clocks.

6. A clock control circuit comprising:

an input buffer for receiving a clock signal input thereto;

a multiphase clock generating circuit, receiving an output signal of said input buffer as an input for generating and outputting a plurality of clocks, phases of which differ from one another;

a selector circuit, receiving a plurality of clocks output from said multiphase clock generating circuit as inputs, for selecting and outputting one of the received clocks;

a first variable delay circuit for delaying an output signal of said selector circuit;

a first clock buffer receiving an output signal of said first variable delay circuit;

a phase comparator circuit for detecting and outputting a phase difference between one of the clocks output from said multiphase clock generating circuit and an output signal of said first clock buffer; and a filter for smoothing the phase-difference detection signal output from said phase comparator circuit;

a delay time of said first variable delay circuit being varied by the output of said filter;

a second variable delay circuit, receiving the output signal of said input buffer, a delay time of said second variable delay circuit varied by the output signal of said filter;

an adder circuit for adding the output signal of said filter and a set value entered to said adder circuit;

a third variable delay circuit receiving the output signal of said first input buffer, a delay time of said third variable delay circuit varied by the output signal of said adder circuit; and second and third clock buffers, receiving output signals of said second and third variable delay circuits, respectively, for producing respective ones of output clock signals.

7. The clock control circuit as defined in claim 6, wherein a pair of mutually complementary clocks are output from said input buffer; and wherein a set of said second variable delay circuit and said second clock buffer and a set of said third variable delay circuit and said third clock buffer are provided for each clock of the pair of complementary clocks.

8. A clock control circuit comprising:

a phase-difference generating circuit for outputting a signal obtained by delaying an input clock signal by a predetermined phase difference on the basis of phase decision information applied thereto;

a first variable delay circuit for delaying an output signal of said phase-difference generating circuit;

a phase comparator circuit for detecting and outputting a phase difference between an output signal of said phase-difference generating circuit and an output signal output from said first variable delay circuit;

a filter for smoothing a phase-difference detection signal output from said phase comparator circuit;

a delay time of said first variable delay circuit varied by the output of said filter; and a second variable delay circuit, a delay time of which is varied by the output of said filter;

wherein a signal obtained by delaying the input clock by said second variable delay circuit is delivered as an output clock signal.

9. The clock control circuit as defined in claim 8, wherein said phase-difference generating circuit comprises:

a frequency divider circuit for frequency dividing an input clock signal;

a first flip-flop for sampling an output signal of said frequency divider circuit at a rising or falling edge of the input clock signal;

a second flip-flop for sampling an output signal of said first flip-flop at a rising or falling edge of the input clock signal;

a first interpolator, receiving output signals of said first and second flip-flops as inputs, for producing an output signal having a delay time decided by a time obtained by dividing the timing difference between the two output signals with a first interior-division ratio; and a second interpolator, receiving output signals of said first and second flip-flops as inputs, for producing an output signal having a delay time decided by a time obtained by dividing the timing difference between the two output signals with a second interior-division ratio.

10. The clock control circuit as defined in claim 9, wherein each of said first and second interpolators comprises:

a logic circuit receiving first and second signals that enter from first and second input terminals;

a switch inserted between a first power supply and an internal node and turned on when an output signal of said logic circuit is at a first value;

a capacitor connected between the internal node and a second power supply;

an inverter having an input terminal connected to the internal node;

N-number of parallel-connected second switches each having one end connected to the internal node and a control terminal to which the first input signal from the first input terminal is supplied;

N-number of parallel-connected third switches each having one end connected to the internal node and a control terminal to which the second input signal from the second input terminal is supplied;

N-number of fourth switches, which are inserted between other ends of respective ones of said second switches and the second power supply and each having a control terminal to which a control signal constituting phase decision information is connected, for being turned on and off; and N-number of fifth switches, which are inserted between other ends of respective ones of said third switches and the second power supply and each having a control terminal to which a control signal constituting phase decision information is connected, for being turned on and off.

11. The clock control circuit as defined in claim 9, wherein each of said first and second interpolators comprises:

a logic circuit receiving first and second signals that enter from first and second input terminals;

a switch inserted between a first power supply and an internal node and turned on when an output signal of said logic circuit is at a first value;

a capacitor connected between the internal node and a second power supply;

an inverter having an input terminal connected to the internal node;

N-number of parallel-connected second switches each having one end connected to the internal node and a control terminal to which a control signal constituting phase decision information is connected, for being turned on and off;

N-number of parallel-connected third switches each having one end connected to the internal node and a control terminal to which a control signal constituting phase decision information is connected, for being turned on and off;

N-number of fourth switches, each being inserted between other ends of respective ones of said second switches and the second power supply and each having a control terminal to which the first input signal from the first input terminal is supplied; and N-number of fifth switches, each being inserted between other ends of respective ones of said third switches and the second power supply and each having a control terminal to which the second input signal from the second input terminal is supplied.

12. A clock control circuit comprising:

an input buffer for receiving a clock input thereto;

a phase-difference generating circuit, receiving an output signal of said input buffer and phase decision information, for outputting a signal obtained by delaying the output signal of said input buffer by a predetermined phase difference on the basis of the phase decision information;

a first variable delay circuit for delaying an output signal of said phase-difference generating circuit;

a first clock buffer receiving an output signal of said first variable delay circuit as an input for driving a dummy load;

a phase comparator circuit for detecting and outputting a phase difference between an output signal of said phase-difference generating circuit and an output signal of said first clock buffer;

a filter for smoothing a phase-difference detection signal output from said phase comparator circuit, a delay time of said first variable delay circuit varied by the output of said filter;

a second variable delay circuit, receiving an output signal of said input buffer, a delay time of second variable delay circuit varied by the output of said filter; and a second clock buffer, receiving an output signal of said second variable delay circuit as an input for outputting an output clock signal.

13. A clock control circuit comprising:

an input buffer for receiving a clock input thereto;

a phase-difference generating circuit, receiving an output signal of said input buffer and phase decision information applied thereto as inputs, for outputting a signal obtained by delaying the output signal of said input buffer by a predetermined phase difference on the basis of the phase decision information;

a first variable delay circuit for delaying an output signal of said phase-difference generating circuit;

a first clock buffer receiving an output signal of said first variable delay circuit as an input for driving a dummy load;

a phase comparator circuit for detecting and outputting a phase difference between an output signal of said phase-difference generating circuit and an output signal of said first clock buffer;

a filter for smoothing a phase-difference detection signal output from said phase comparator circuit, a delay time of said first variable delay circuit varied by an output signal of said filter;

a second variable delay circuit, receiving the output signal of said input buffer as an input, a delay time of second variable delay circuit varied by the output signal of said filter;

an adder circuit for adding the output signal of said filter and an entered set value;

a third variable delay circuit, receiving the output signal of said input buffer as an input, a delay time of the third variable delay circuit varied by the output of said adder circuit; and second and third clock buffers, receiving output signals of said second and third variable delay circuits, respectively, for outputting first and second output clock signals.

14. A clock control circuit comprising:

a phase-difference generating circuit, receiving an input clock signal and an output clock signal, for producing first and second output signals, a phase difference between the first and second output signals decided by phase decision information entered thereto, based upon the input clock signal and the output clock signal;

a first variable delay circuit for delaying the second output signal of said phase-difference generating circuit;

a phase comparator circuit for detecting and outputting a phase difference between the first and second output signals output from said phase-difference generating circuit;

a filter for smoothing a phase-difference detection signal output from said phase comparator circuit, a delay time of said first variable delay circuit varied by the output signal of said filter; and a second variable delay circuit having a delay time varied by the output signal of said filter;

wherein signals obtained by delaying the input clock by each of said first and second variable delay circuits are delivered as first and second output clock signals, and the first output clock signal enters said phase-difference generating circuit as the output clock signal.

15. A clock control circuit comprising:

an input buffer for receiving a clock signal input thereto;

a phase-difference generating circuit, receiving an input clock signal output from said input buffer from one input terminal and one output clock signal from another input terminal, for producing first and second output signals having a phase difference decided by phase decision information entered thereto, said first and second output signals being signals obtained by delaying the input clock signal and the output clock signal by an interior-division ratio decided by the phase decision information;

a phase comparator circuit for detecting and outputting a phase difference between the first and second signals output from said phase-difference generating circuit;

a filter for smoothing a phase-difference detection signal output from said phase comparator circuit;

a first variable delay circuit, having a delay time varied based upon the output signal of said filter, for delaying the output signal of said input buffer;

a first clock buffer, receiving an output signal of said first variable delay circuit, for producing a first output clock signal, the first output clock being fed to said phase-difference generating circuit as said one output clock;

an adder circuit for adding the output signal of said filter and an entered set value;

a second variable delay circuit, receiving the output signal of said input buffer, and having a delay time varied by the output signal of said adder circuit; and a second clock buffer, receiving an output signal of said second variable delay circuit, for producing a second output clock signal.

16. The clock control circuit as defined in claim 15, wherein a pair of mutually complementary clocks are output from said input buffer; and wherein a set of said first variable delay circuit and said first clock buffer and a set of said second variable delay circuit and said second clock buffer are provided for each clock of the pair of complementary clocks.

17. A clock control method comprising the steps of:

generating, by a multiphase clock generating circuit receiving an input clock signal from an input buffer, a plurality of clocks, the phases of which differ from one another, from the input clock signal;

selecting one of the clocks from said multiphase clock generating circuit by a selector circuit;

delaying the selected clock by a first variable delay circuit;

detecting, by a phase comparator circuit, a phase difference between an output signal of a clock buffer receiving an output signal from said first variable delay circuit and one of the clocks output from said multiphase clock generating circuit, and variably adjusting a delay time of said first variable delay circuit on the basis of a signal obtained by smoothing the result of the phase comparison by a filter; and producing an output clock signal, having a desired phase relationship with respect to the input clock signal, from a clock buffer that receives an output signal from a second variable delay circuit, to which an output signal of said input buffer is fed and which has a delay time varied by the output signal of said filter.

18. The clock control method as defined in claim 17, further comprising the steps of:

adding the output of said filter and entered addition information by an adder circuit;

providing a variable delay circuit, a delay time of which varied by an output signal from said adder circuit, for delaying and outputting the output signal of said input buffer; and delivering an output from said variable delay circuit via a clock buffer.

19. A clock control method comprising the steps of:

supplying an output signal of an input buffer, which receives an entered clock, to a phase-difference generating circuit;

generating, by said phase-difference generating circuit, a signal obtained by delaying an output signal of said input buffer by a predetermined phase difference on the basis of phase decision information applied thereto;

detecting, by a phase comparator circuit, a phase difference between an output of a clock buffer dummy, which receives as an input an output signal from a first variable delay circuit that delays an output signal of said phase-difference generating circuit, and the output signal of said phase-difference generating circuit;

smoothing a result of the phase comparison by a filter and varying delay time of said first variable delay circuit by an output signal from said filter; and producing an output clock signal from a clock buffer which receives as an input an output signal from a second variable delay circuit which receives an output signal of said input buffer and which has its delay time varied by the output of said input buffer.

* * * * *